United States Patent
Ishida et al.

(10) Patent No.: US 7,222,776 B2
(45) Date of Patent: May 29, 2007

(54) PRINTED WIRING BOARD AND MANUFACTURING METHOD THEREFOR

(75) Inventors: Naoto Ishida, Ogaki-shi (JP); Kouji Asano, Ogaki-shi (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 0 days.

(21) Appl. No.: 10/927,413

(22) Filed: Aug. 26, 2004

(65) Prior Publication Data

US 2005/0023034 A1    Feb. 3, 2005

Related U.S. Application Data

(62) Division of application No. 10/195,865, filed on Aug. 31, 2004, now Pat. No. 6,784,374, which is a division of application No. 09/359,981, filed on Jul. 23, 1999, now Pat. No. 6,444,924.

(30) Foreign Application Priority Data

Jan. 30, 1997  (JP) .................................. 9-33033
Jan. 30, 1997  (JP) .................................. 9-33034
Nov. 25, 1997  (JP) ................................. 9-340723

(51) Int. Cl.
*B23K 31/02*    (2006.01)
*B23K 35/12*    (2006.01)
*H01L 23/52*    (2006.01)

(52) U.S. Cl. ................. 228/246; 228/180.22; 228/245; 228/56.3; 257/774

(58) Field of Classification Search ............ 228/180.21, 228/180.22, 245, 246
See application file for complete search history.

(56) References Cited

U.S. PATENT DOCUMENTS 4,830,264 A  *  5/1989  Bitaillou et al. ....... 228/180.21

(Continued)

FOREIGN PATENT DOCUMENTS

AT          401 704 B       11/1996

(Continued)

OTHER PUBLICATIONS

Abstract: Japanese Application No. JP 04-217470, filed Jul. 24, 1992, Japanese Publication No. JP 06-045722, published Feb. 18, 1994, of Ibiden Co., Ltd., pertains to a Pin-Erected Type Printed Circuit Substrate.

(Continued)

*Primary Examiner*—Lynne R. Edmondson
(74) *Attorney, Agent, or Firm*—Oblon, Spivak, McClelland, Maier & Neustadt, P.C.

(57) ABSTRACT

A printed wiring board has a circuit substrate 6 having a conductor circuit 5 and a through hole 60, and also has a joining pin 1 inserted into the through hole. The joining pin is manufactured by using a material unmelted at a heating temperature in joining the joining pin to an opposite party pad 81. The joining pin is constructed by a joining head portion 11 having a greater diameter than an opening diameter of the through hole. The joining pin forms a joining portion for joining and connection to the opposite party pad. The joining pin has a leg portion 12 having a diameter smaller than the through hole. The leg portion is inserted into the through hole and is joined to the through hole by a conductive material such as a soldering material 20, etc. In lieu of a joining pin, a joining ball approximately having a spherical shape can be joined to the through hole by the conductive material.

5 Claims, 17 Drawing Sheets

U.S. PATENT DOCUMENTS

| | | | | |
|---|---|---|---|---|
| 5,450,290 | A | * | 9/1995 | Boyko et al. ................ 361/792 |
| 5,485,039 | A | * | 1/1996 | Fujita et al. ................. 257/774 |
| 6,460,755 | B1 | * | 10/2002 | Inoue et al. ................. 228/246 |
| 6,518,518 | B1 | * | 2/2003 | Saiki et al. .................. 174/267 |
| 6,850,084 | B2 | * | 2/2005 | Hembree .................... 324/765 |
| 6,896,526 | B2 | * | 5/2005 | Pitzele ......................... 439/83 |
| 2003/0121957 | A1 | * | 7/2003 | Cobbley et al. ............. 228/245 |
| 2005/0153101 | A1 | * | 7/2005 | Yamaguchi et al. ........ 428/131 |

FOREIGN PATENT DOCUMENTS

| | | | |
|---|---|---|---|
| EP | 98 90 0160 | | 5/2004 |
| FR | 84 15326 | | 10/1984 |
| FR | 2571547 | | 4/1986 |
| FR | 9508969 | | 7/1995 |
| FR | 2722916 | | 1/1996 |
| JP | 62-164897 | | 6/1987 |
| JP | 63298242 | | 11/1988 |
| JP | 64-008649 | | 1/1989 |
| JP | 01061572 | | 3/1989 |
| JP | 01-232392 | | 9/1989 |
| JP | 02144945 A | | 6/1990 |
| JP | 02239577 A | | 9/1990 |
| JP | 03-095962 | | 4/1991 |
| JP | 06-007252 | | 1/1994 |
| JP | 06-154511 | | 7/1994 |
| JP | 07-038245 | | 2/1995 |
| JP | 07-212021 | | 8/1995 |
| JP | 07238022 | | 9/1995 |
| JP | 08-023047 | | 1/1996 |
| JP | 08-023047 A | * | 1/1996 |
| JP | 08-236911 | | 9/1996 |
| JP | 09082873 A | | 3/1997 |
| JP | 09-340723 | | 11/1997 |
| JP | 09-321184 A | * | 12/1997 |
| JP | 10-275966 | | 10/1998 |
| JP | 10-275966 A | * | 10/1998 |
| JP | 11-102986 A | * | 4/1999 |

OTHER PUBLICATIONS

Abstract: Japanese Application No. JP 01-285337, filed Oct. 31, 1989, Publication No. JP 03-145791, published Jun. 20, 1991, of Ibiden Co., Ltd., pertains to a Printed Wiring Board.

Abstract: Japanese Application No. JP 61-087834, filed Jun. 16, 1986, Publication No. JP 62-244156, published Oct. 24, 1987, of Ibiden Co., Ltd., pertains to a Surface Mounting Package.

Abstract: Japanese Application No. JP 05-143330, filed Jun. 15, 1993, Publication No. JP 07-014942, published Jan. 17, 1995, of Shinko Electronic Ind. Co. Ltd., pertains to a Semiconductor Device.

Abstract: Japanese Application No. JP 07-036291, filed Jan. 31, 1995, Publication No. JP 08-213748, published Aug. 20, 1996, of Mitsui High Tec Inc., pertains to a Board and Manufacture Thereof.

Japanese Utility Model 2-102738 U, (English translation) Japanese Application No. JP 01-9933, filed Jan. 31, 1989, of Citizen Watch Co., Ltd., pertains to an IC Mounting Structure.

European Patent Office Communication of Aug. 10, 2004 for corresponding European Patent Application No. EP98900160.7, of Ibiden Co., Ltd.

European Patent Office Communications of Mar. 23, 2005 for corresponding European Patent Application No. EP98900160.7, of Ibiden CO., Ltd.

International Search Report of corresponding International Patent Application No. PCT/JP98/00006.

* cited by examiner

PRINTED WIRING BOARD AND MANUFACTURING METHOD THEREFOR

CROSS REFERENCES TO RELATED APPLICATIONS

This application is a division of U.S. Pat. No. 6,784,374, issued Aug. 31, 2004, U.S. patent application Ser. No. 10/195,865, filed Jul. 15, 2002, which is a division of U.S. Pat. No. 6,444,924, issued Sep. 3, 2002, U.S. patent application Ser. No. 09/359,981, filed Jul. 23, 1999, which is based upon priority International Application PCT/JP98/00006 filed Dec. 11, 1998, which is based upon priority Japanese Application No. 9-33033 filed Jan. 30, 1997, priority Japanese Application No. 9-33034 filed Jan. 30, 1997 and priority Japanese Application No. 9-340723 filed Nov. 25, 1997.

BACKGROUND OF THE INVENTION

1. Technical field

The present invention relates to a printed wiring board and its manufacturing method, and particularly relates to joining of the printed wiring board and a mother board.

2. Background art

For example, as shown in FIG. 27, there is conventionally a printed wiring board having a circuit substrate 96 having a mounting portion 97 for mounting an electronic part 970 thereto, a conductor circuit 95 arranged on a surface of the circuit substrate 96 and also arranged within this circuit substrate 96, and a through hole 93 extending through the circuit substrate 96.

The electronic part 970 is electrically connected to the conductor circuit 95 by a bonding wire 971. As shown in FIGS. 27 and 28, a pad 92 for mounting a ball thereto is arranged at an end tip of the conductor circuit 95 on a rear face side of the circuit substrate 96. A soldering ball 91 is joined to a surface of this pad 92.

The above conventional printed wiring board 9 is joined to an opposite party pad 981 arranged on the surface of a mother board 98 by heating and melting the above soldering ball 91.

The printed wiring board fulfills a function for transmitting electric information of the electric part to a partner member such as the mother board, etc. by the above structure.

However, the above conventional printed wiring board has the following problems. Namely, as shown in FIGS. 27 and 28, the printed wiring board 9 is fixedly joined onto the mother board 98 by the soldering ball 91. Therefore, the pad 92 for mounting the soldering ball must be arranged in the printed wiring board 9.

Further, it is necessary to arrange the conductor circuit 95 between the pad 92 for mounting the ball and the through hole 93 and electrically connect the pad 92 and the through hole 92. Therefore, as shown in FIG. 28, the rear face side of the circuit substrate 96 is occupied by the pad 92 for mounting the ball and the conductor circuit 95 connected to the through hole 93 as well as the through hole 93. Therefore, it is difficult to secure a sufficient space for arranging another conductor circuit on the rear face side of the circuit substrate 96 so that high density wiring is prevented.

When the soldering ball 91 is joined to the opposite party pad 981, it is difficult to control a melting state of the soldering ball 91. Namely, the soldering ball 91 is melted and joined by heating this soldering ball 91 to the opposite party pad 981 on the mother board 98. At this time, the melting state of the soldering ball 91 is different in accordance with elements such as heating temperature, applied pressure, soldering composition, etc. Therefore, as shown in FIG. 27, there is a case in which a melting degree of the soldering ball 91 on one side (e.g., a right-hand side of FIG. 27) of the printed wiring board 9 is increased and the melting degree of the soldering ball 91 on the other side (e.g., a left-hand side of FIG. 27) is decreased. In this case, the printed wiring board 9 is slantingly joined to the mother board 98. Accordingly, it is difficult to join the conventional printed wiring board 9 to the mother board 98 in parallel with this mother board 98.

In addition, as shown in FIG. 29, the pad 92 for mounting the ball and joining the soldering ball 91 is generally covered with a gold plating film 921. A gold component of the gold plating film 921 permeates the interior of the soldering ball 91 in heating and melting the soldering ball 91, and forms an intermediate layer 90 between the metallic plating film 921 and the soldering ball 91.

This intermediate layer 90 has a property deteriorated by heat. Therefore, when the intermediate layer 90 is formed, joining strength of the pad 92 for mounting the ball and the soldering ball 91 is reduced until 1.0 to 1.4 kg/cm$^2$.

Further, the intermediate layer 90 is increased in thickness as the gold plating film 921 covering the pad 92 for mounting ball is increased in thickness. Therefore, when the thickness of the gold plating film 921 is increased, the joining strength of the pad 92 for mounting the ball and the soldering ball 91 is further reduced. Accordingly, there is a case in which the joining strength is reduced to a joining strength equal to or smaller than 1.0 kg/cm$^2$.

With consideration of such conventional problems, the present invention provides a printed wiring board able to perform high density wiring on a substrate surface and able to be joined to a partner member in parallel with this partner member and having an excellent joining strength, and also provides a manufacturing method of the printed wiring board.

BRIEF SUMMARY OF THE INVENTION

The present invention resides in a printed wiring board having a circuit substrate. The printed wiring board has a conductor circuit and a through hole. A joining pin is inserted and positioned into the through hole. The printed wiring board can be characterized in that the joining pin is manufactured by using a material unmelted at a heating temperature in joining the joining pin to an opposite party pad. The joining pin has a joining head portion which spans a greater diameter than an opening diameter of the through hole. The joining pin also forms and provides a joining portion for joining and connection to the opposite party pad. The joining pin further has a leg portion which extends from the joining head portion. The leg portion has a smaller diameter than the through hole and the joining head portion. Desirably, the leg portion is inserted and positioned into the through hole and is joined to the through hole by a conductive material. The joining head portion can comprise an enlarged end section that provides an enlarged end of the joining portion, while the leg portion can comprise a smaller diameter end section that provides a smaller end of the joining portion.

An operation and effects of the present invention will now be explained.

In the printed wiring board of the present invention, the joining pin is inserted into the through hole. The joining pin has the joining head portion for joining the joining pin to the opposite party pad. Therefore, the through hole and the opposite party pad can be electrically connected to each other by the joining pin by joining the joining head portion to the opposite party pad.

Further, since the through hole and the opposite party pad can be connected to each other by the joining pin in a facing state, as in the conventional case, it is unnecessary to arrange a pad for mounting a soldering ball in addition to the through hole. With this invention, it is also unnecessary to form a conductor circuit for connecting the through hole and the pad for mounting the ball as in the conventional case. Therefore, in the invention a surplus space is formed on a surface of the circuit substrate in a portion except for an opening portion of the through hole. Accordingly, a high density wiring structure can be realized on the substrate surface by forming many other conductor circuits in this space.

The joining pin is manufactured by using a material unmelted at the heating temperature to join the joining pin to the opposite party pad. Therefore, a constant height of the joining head portion is maintained without melting deformation in the above joining. Accordingly, the joining head portion functions as a strut of the printed wiring board at the joining time.

Such a joining head portion functioning as a strut spans a greater diameter than the opening diameter of the through hole. Therefore, when the leg portion of the joining pin is inserted into the through hole, the joining head portion is engaged with the opening portion of the through hole and does not enter the interior of the through hole. Accordingly, the joining head portion can be projected by the same height from a surface of the circuit substrate.

Therefore, when the joining head portion and the opposite party pad are joined to each other, the distance between the printed wiring board and a partner member such as a mother board having the above opposite party pad, etc. is constantly secured by the above joining head portion. Accordingly, the printed wiring board can be joined to the partner member in a parallel arranging state.

Since no joining pin is melted and deformed at the heating temperature in the joining, it is not necessary to control a melting state of the conductive material for joining. Accordingly, the joining pin and the opposite party pad can be easily joined to each other.

In the present invention, the leg portion of the joining pin is inserted into the through hole, and the leg portion and the through hole are joined to each other by the conductive material. Further, since no printed wiring board of the present invention has a structure for joining a soldering ball to the pad for mounting the ball as in the conventional example, there is no fear that an intermediate layer causing a reduction in joining strength is formed between the soldering ball and the pad for mounting the ball. Accordingly, the joining pin can be strongly fixed to the through hole.

It is preferable to cover the joining head portion of the above joining pin with the conductive material. When this joining head portion is arranged on the opposite party pad on the partner member and is heated, the conductive material covering a surface of the joining head portion is melted so that the joining head portion and the opposite party pad are joined to each other. Accordingly, the joining head portion and the opposite party pad can be reliably joined to each other so that the printed wiring board can be easily mounted to the partner member.

The above leg portion preferably has projecting portions projected in plural directions. In this case, a clearance having a wavy shape in cross section is formed within the through hole between the plural projecting portions in the leg portion. The leg portion is reliably joined to an inner wall of the through hole by the conductive material in this wavy clearance. Accordingly, the joining pin can be strongly fixed to the through hole.

The above joining head portion is preferably constructed by a spherical body. In this case, the joining head portion of the joining pin can be stably joined to the opposite party pad.

For example, a manufacturing method of the printed wiring board can be characterized in that the manufacturing method comprises:

a process for preparing a circuit substrate having a conductor circuit and a through hole;

a process for manufacturing a joining pin formed by a material unmelted at a heating temperature in joining the joining pin to an opposite party pad, and constructed by a leg portion and a joining head portion spanning a diameter greater than an opening diameter of the through hole and forming a joining portion to the opposite party pad;

a process for inserting the leg portion of the joining pin into the through hole; and a process for filling the interior of the through hole with a conductive material and joining the through hole and the leg portion to each other by the conductive material.

In the present invention, the leg portion of the joining pin is inserted into the through hole. The joining pin has the joining head portion for joining the joining pin to the opposite party pad. Therefore, in accordance with the manufacturing method of the present invention, it is possible to obtain a printed wiring board for electrically connecting the through hole and the opposite party pad to each other by the joining pin. Advantageously, it is not necessary to arrange the pad for mounting a ball, etc. as in the conventional case. Accordingly, another conductor circuit can be further formed in a surplus space formed on a surface of the circuit substrate so that high density wiring can be performed.

The joining pin is manufactured by using a material unmelted in joining the joining pin to the opposite party pad. Therefore, it is possible to obtain a printed wiring board able to be joined to a partner member, etc. in parallel with this partner member. Further, since the joining pin is joined to the through hole by the conductive material by inserting the joining head portion of the joining pin into the through hole, joining strength to the opposite party pad is high.

It is preferable to cover the joining head portion of the above joining pin with the conductive material in advance before the joining head portion is inserted into the through hole. In this case, the printed wiring board can be reliably and easily mounted to the partner member.

The above conductive member is preferably a soldering member. In this case, the leg portion of the joining pin can be reliably joined to the through hole to provide electric conductivity between the leg portion and the through hole.

The above conductive material may be constructed by epoxy resin impregnated with a silver filler. In this case, the leg portion of the joining pin can be reliably joined to the through hole and the electric conductivity between the leg portion and the through hole is preferable.

A further invention of a printed wiring board constructed by joining a joining ball instead of the above joining pin to the through hole will next be explained. Such an invention comprises a printed wiring board having a circuit substrate having a conductor circuit and a through hole, and a joining ball joined to said through hole. The printed wiring board can be characterized in that said joining ball is manufactured by using a material unmelted at a heating temperature in joining the joining ball to an opposite party pad. Desirably, the printed wiring board is constructed by a joining head portion which spans a greater diameter than an opening portion of the through hole. The joining head portion can form a joining portion for being joined, secured and connected to the opposite party pad. The printed wiring has a bottom portion which faces the opening portion of the through hole. The bottom portion is arranged in the opening portion of the through hole and is joined to the through hole by a conductive material filling the interior of the through hole.

It is most noticeable in the present invention that the joining ball having the joining head portion is joined to the through hole and the bottom portion of the joining ball is joined to the through hole by the conductive material filling the interior of the through hole.

The above joining ball has the joining head portion for joining the joining ball to the opposite party pad and also has the bottom portion which faces the opening portion of the through hole. The joining head portion greater in diameter and size than a diameter of the opening portion of the through hole. The joining head portion projects from the through hole. The bottom portion is a portion facing the opening portion and is joined to the through hole by the conductive material.

An operation and effects of the present invention will now be explained.

In the printed wiring board of the present invention, the joining ball is joined to the through hole. The joining ball has the joining head portion for joining the joining ball to the opposite party pad. Therefore, the through hole and the opposite party pad can be electrically connected to each other by the joining ball by joining the joining head portion to the opposite party pad.

Further, the joining ball is joined to the opening portion of the through hole. Therefore, the through hole and the opposite party pad can be electrically connected to each other in a facing state. Accordingly, with this invention it is unnecessary to arrange a pad for mounting a soldering ball in addition to the through hole as in the conventional case.

It is also unnecessary with this invention to form a conductor circuit for connecting the through hole and the pad for mounting the ball as in the conventional case.

Therefore, a surplus space is formed on a surface of the circuit substrate in a portion except for the opening portion of the through hole. Accordingly, many other conductor circuits can be formed in this space so that a high density wiring structure can be realized on the substrate surface.

The joining ball is manufactured by using a material unmelted at the heating temperature in joining the joining ball to the opposite party pad. Therefore, a constant height of the joining ball is maintained without melting deformation in the above joining. Accordingly, the joining ball functions as a strut of the printed wiring board at the joining time.

The joining head portion of such a joining ball functioning as a strut is greater in size and diameter than the opening portion of the through hole. Therefore, when the joining ball is joined to the through hole as in the conventional example, the joining head portion is engaged with the opening portion of the through hole and does not enter the interior of the through hole. Accordingly, the joining head portion can be projected by the same height from a surface of the circuit substrate.

Therefore, when the joining head portion and the opposite party pad are joined to each other, the distance between the printed wiring board and a partner member such as a mother board having the above opposite party pad, etc. is constantly secured by the above joining head portion. Accordingly, the printed wiring board can be joined to the partner member in a parallel arranging state.

Since no joining ball is melted and deformed at the heating temperature in the joining, it is not necessary in this invention to control a melting state of the conductive material for joining. Accordingly, the joining ball and the opposite party pad can be easily joined to each other.

In the present invention, the joining ball is arranged in the opening portion of the through hole, and the joining ball and the through hole are joined to each other by the conductive material. Further, since no printed wiring board of the present invention has a structure for joining a soldering ball to the pad for mounting the ball as in the conventional example, there is no fear that an intermediate layer causing a reduction in joining strength is formed between the soldering ball and the pad for mounting the ball. Accordingly, the joining ball can be strongly fixed to the through hole.

It is preferable to cover the joining head portion of the above joining ball with the conductive material.

In this case, when the joining head portion is arranged on the opposite party pad on the mother board and is heated, the conductive material covering a surface of the joining head portion is melted so that the joining head portion and the opposite party pad are easily joined to each other. Accordingly, the joining head portion and the opposite party pad can be reliably joined to each other so that the printed wiring board can be easily mounted to the partner member, etc.

The above joining head portion is preferably set to a spherical body. In this case, the joining head portion of the joining ball can be stably joined to the opposite party pad on the mother board.

The bottom portion of the joining ball may be also constructed by a flat face, one portion of a spherical surface or a convex shape. The bottom portion is preferably constructed by a flat face in view of easiness of mounting.

For example, there is a manufacturing method of the printed wiring board having the above joining ball. This manufacturing method of the printed wiring board is characterized in that the manufacturing method comprises:

a process for preparing a circuit substrate having a conductor circuit and a through hole;

a process for manufacturing a joining ball formed by a material unmelted at a heating temperature in joining the joining ball to an opposite party pad, and constructed by a bottom portion and a joining head portion greater in size and diameter than an opening portion of the through hole and forming a joining portion to the opposite party pad;

a process for arranging said joining ball in a state in which the bottom portion faces the opening portion of the through hole; and a process for filling the interior of said through hole with a conductive material and joining said through hole and the bottom portion to each other by the conductive material.

In the present invention, the joining ball having the joining head portion is arranged in the opening portion of the through hole and is joined to the through hole by filling the interior of the through hole with the conductive material. Therefore, in accordance with the manufacturing method of the present invention, it is possible to obtain a printed wiring board for electrically connecting the through hole and the opposite party pad to each other by the joining ball.

Therefore, it is unnecessary to arrange the pad for mounting the ball, etc. as in the conventional case. Accordingly, another conductor circuit can be further formed in a surplus space formed on a surface of the circuit substrate so that high density wiring can be performed.

The joining ball is manufactured by using a material unmelted in joining the joining ball to the opposite party pad. Therefore, it is possible to obtain a printed wiring board able to be joined to a partner member, etc. in parallel with this partner member. Further, since the bottom portion of the joining ball is opposed to the opening portion of the through hole and the joining ball is joined to the through hole by the conductive material, joining strength to the opposite party pad is high.

It is preferable to cover the joining head portion of the above joining ball with the conductive material in advance before the joining head portion is arranged in the through hole. In this case, the printed wiring board can be reliably and easily mounted to the partner member.

The process for arranging the above joining ball and the process for filling the interior of the through hole with the conductive material are preferably performed in a state in which the joining head portion of the above joining ball is adsorbed and drawn to a sucking (negative pressure) port of a sucking (suction) device. In this case, the joining ball can be easily joined to the through hole.

The interior of the above through hole is filled with the conductive material from the opening portion on an arranging side of the joining ball, and is also filled with the conductive material from an opening portion on a side opposed to the opening portion on the arranging side of the joining ball. The interior of the through hole may be filled with the conductive material before the joining ball is arranged in the opening portion. Further, the interior of the through hole may be filled with the conductive material after the joining ball is arranged in the opening portion. For example, the interior of the through hole is filled with the conductive material by a method for printing the conductive material formed in a paste shape in the opening portion of the through hole and heating and reflowing this conductive material, a method for dipping the opening portion of the through hole into the melted conductive material, a flow soldering method, etc.

Similar to the invention relative to the above joining pin, it is also preferable to use a soldering material, epoxy resin impregnated with a silver filler, etc. as the above conductive material in the present invention relative to the joining ball. However, the present invention is not limited to this case.

The interior of the through hole is filled with the conductive material by using a method similar to that in the case of the invention relative to the above joining pin.

A more detailed description of the invention is provided in the following description and appended claims taken in conjunction with the accompanying drawings.

EXPLANATION OF REFERENCE NUMERALS

1—joining pin,
11—joining head portion,
12—leg portion,
111—lower portion,
112—groove,
121—end tip portion,
122—central portion,
125—projecting portion,
2—solder, 20—soldering material,
100—printed wiring board,
3—joining ball,
31—joining head portion,
32—bottom portion,
39—sucking device,
4—heat radiating plate,
5—conductor circuit,
6—circuit substrate,
60—through hole,
61—resin substrate,
7—mounting portion,
8—mother board,
81—opposite party pad.

DETAILED DESCRIPTION OF THE INVENTION

The following is a detailed description and explanation of the preferred embodiments and best modes for embodying the invention along with some examples thereof.

EMBODIMENT MODE EXAMPLE 1

An example of a printed wiring board in an embodiment mode in the present invention will be explained next by using FIGS. 1 to 10.

Figure 1:
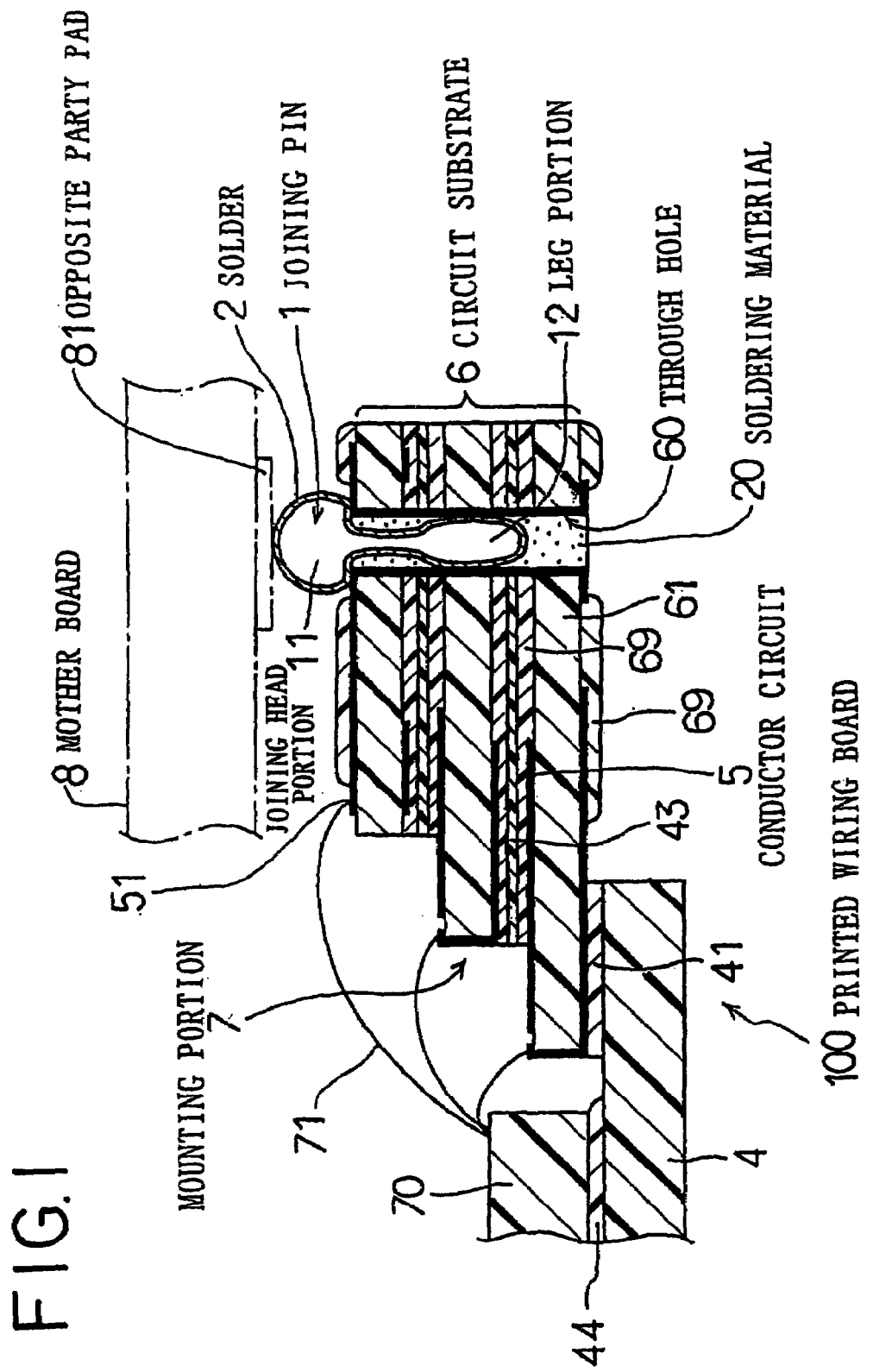
FIG. 1 is a partial sectional view of a printed wiring board in an embodiment mode example 1.

As shown in FIG. 1, the printed wiring board 100 in this example has a circuit substrate 6 having a conductor circuit 5, a through hole 60, and a joining pin 1 inserted into the through hole 60.

The joining pin 1 is manufactured by using a material unmelted at a heating temperature when the joining pin 1 is soldered and joined to an opposite party pad 81 on a mother board 8. For example, the joining pin 1 is manufactured by using covar, phosphor bronze, etc. The joining pin 1 is constructed by an enlarged joining head portion 11 and a leg portion 12. The joining head portion 11 is greater in diameter than an opening diameter of the through hole 60 the leg portion 12. The joining leg portion provides and forms a joining portion for connection to the opposite party pad 81. The joining head portion 11 comprises an enlarged end section which provides an enlarged end of the joining portion, while the leg portion 12 comprises smaller diameter end section which provides a smaller end of the joining portion. The leg portion 12 extends from the head portion and has a diametric size (diameter) smaller than the diameter of the through hole 60. The leg portion 12 also has a smaller diameter than the diameter of the joining head portion 11. The leg portion 12 is inserted and positioned into the through hole 60 and is joined to a wall face of the through hole 60 by a soldering material 20.

Figure 2:
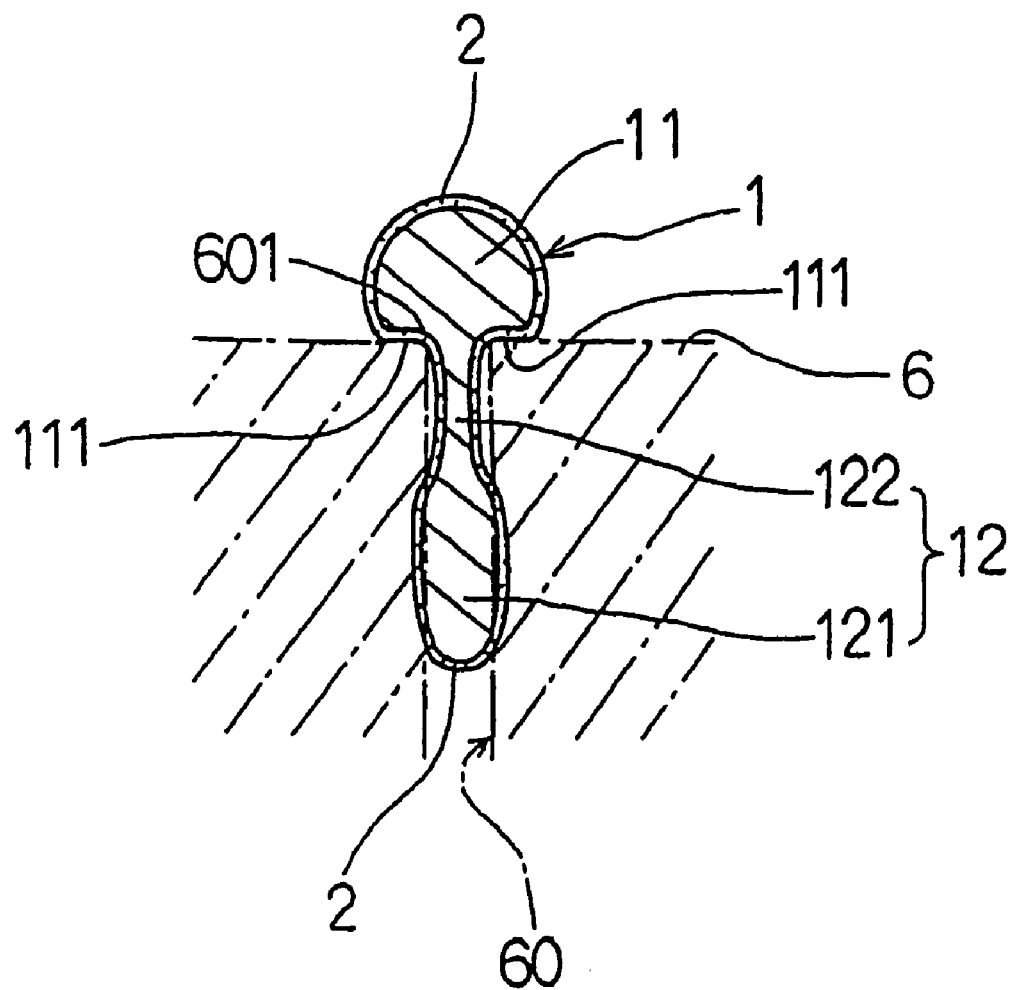
FIG. 2 is a cross-sectional view of a joining pin in the embodiment mode example 1.

As shown in FIG. 2, the joining head portion 11 and the leg portion 12 of the joining pin 1 are covered with solder 2 having 10 μm in thickness.

The joining head portion 11 is formed in the shape of a spherical body having 0.75 mm in diameter and has 0.6 mm in height. A lower portion 111 of the joining head portion 11, i.e., a portion opposed to the circuit substrate 6 in the joining head portion 11 forms a flat face. A central portion 122 of the leg portion 12 is smaller than an end tip portion 121 of the leg portion 12. A maximum diameter of the end tip portion 121 of the leg portion 12 is set to 0.35 mm. A minimum diameter of the central portion 122 of the leg portion 12 is set to 0.2 mm. The leg portion 12 has a length of 1.6 mm.

An opening diameter of the through hole 60 is set to 0.32 mm. The through hole 60 has a length of 1.8 mm.

As shown in FIG. 1, the circuit substrate 6 is formed by laminating and press-attaching with an adhesive 43, plural resin substrates 61. A surface of each resin substrate 61 is covered with a resist film 69. A concave mounting portion 7 for mounting an electronic part 70 is formed in the circuit substrate 6. A bottom face of the mounting portion 7 is formed by a heat radiating plate 4 adhered to the circuit substrate 6. The heat radiating plate 4 is adhered to the circuit substrate 6 by an adhesive 41.

Figure 10:
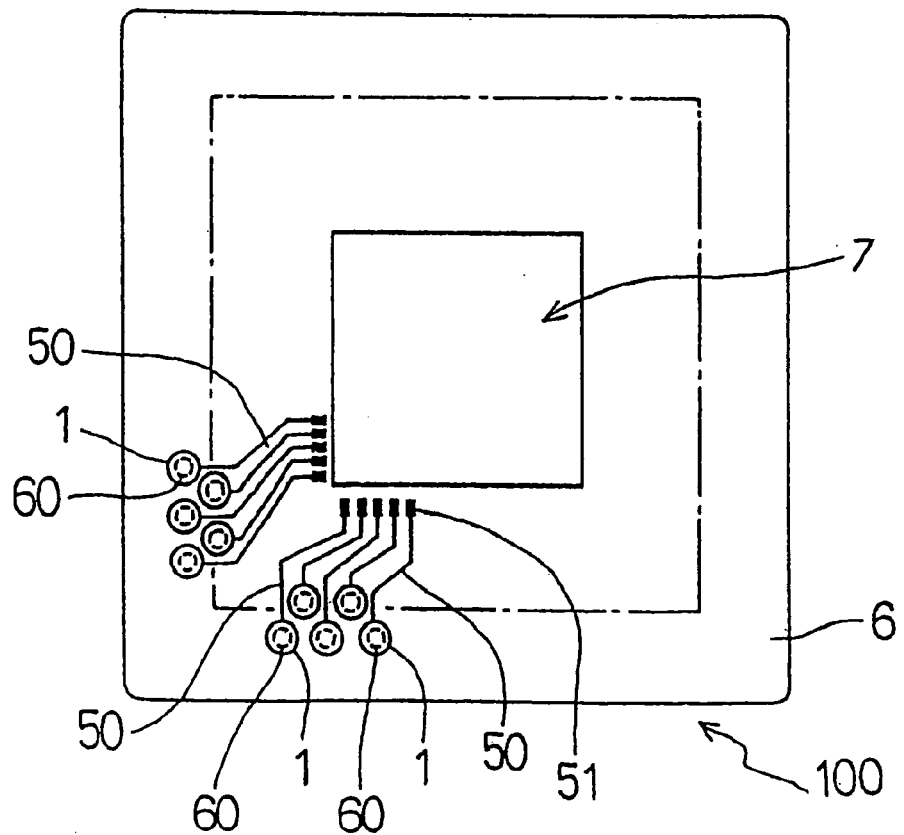
FIG. 10 is a plan explanatory view of the printed wiring board in the embodiment mode example 1.

As shown in FIGS. 1 and 10, the conductor circuit 5 is arranged on a surface of the circuit substrate 6 and is also arranged within this circuit substrate 6. The conductor circuit 5 has a bonding pad portion 51 in the vicinity of the mounting portion 7. A bonding wire 71 is connected to the electronic part 70 and is joined to the bonding pad portion 51 by solder.

The printed wiring board 100 in this example is a substrate of a face-down type for mounting electronic parts. In this printed wiring board 100, the mounting portion 7 for mounting the electronic part 70 is arranged oppositely to the mother board 8.

Figure 5:
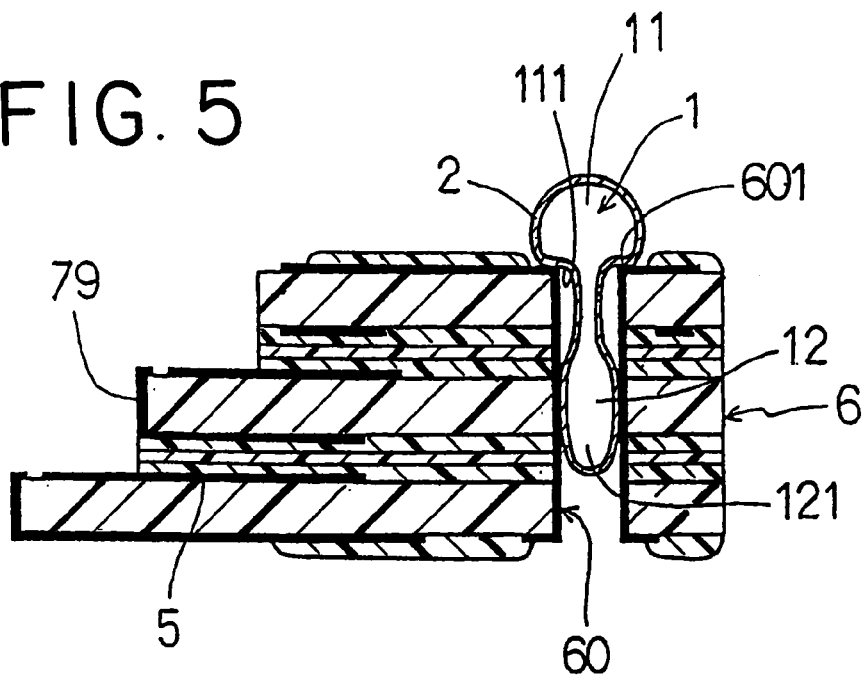
FIG. 5 is an explanatory view showing a method for inserting the joining pin into the through hole in the embodiment mode example 1.
Figure 6:
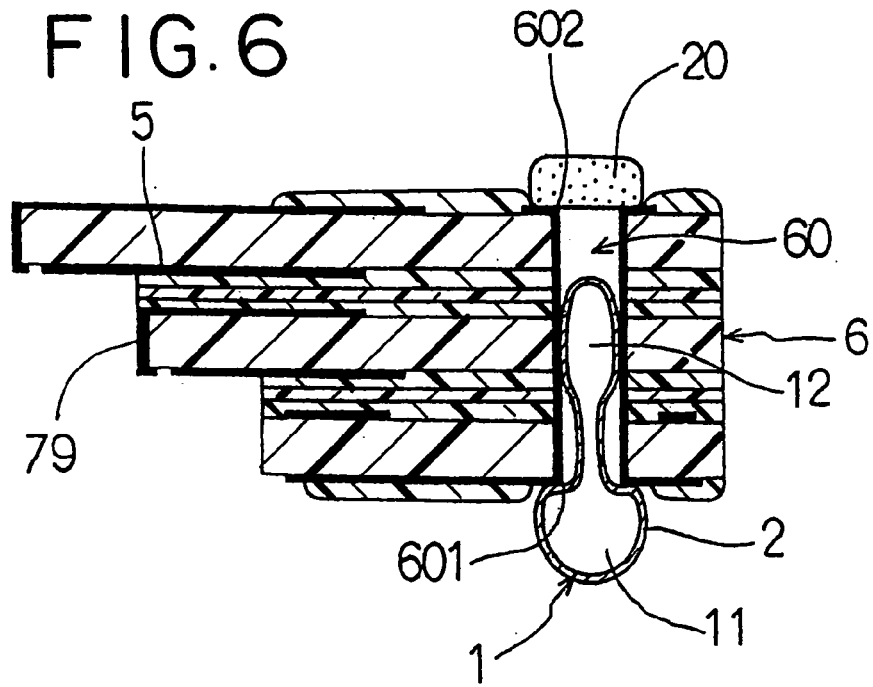
FIG. 6 is an explanatory view showing a state in which a soldering material is arranged on an opening portion of the through hole in the embodiment mode example 1.

When the above printed wiring board is manufactured, the circuit substrate 6 is formed (FIG. 3), the joining pin 1 is inserted (FIG. 5), and the joining pin 1 is joined by the soldering material 20 (FIG. 6). A manufacturing method of the printed wiring board will next be explained in detail.

Figure 3:
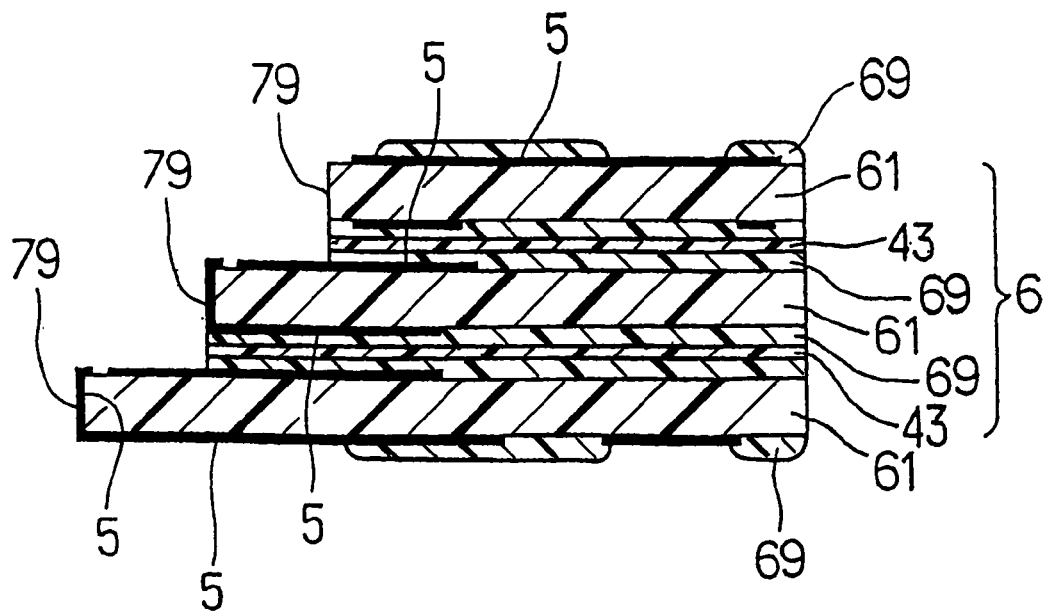
FIG. 3 is an explanatory view of a circuit substrate in the embodiment mode example 1 in which plural resin substrates are laminated, pressed and attached to each other.

First, a copper foil is stuck to plural resin substrates and a through hole for forming a mounting portion is bored. The copper foil is etched and a conductor circuit 5 is formed on a surface of each resin substrate 61 as shown in FIG. 3. Next, the conductor circuit 5 is also formed in the inner wall of a through hole 79 by a plating method.

Next, the surface of each resin substrate 61 is covered with a resist film 69 except for the through hole 79 and a portion near a through hole forming portion. Next, these resin substrates 61 are laminated and thermally press-attached to each other through an epoxy-system adhesive 43. Thus, a circuit substrate 6 having the multilayer conductor circuit 5 is obtained.

Figure 4:
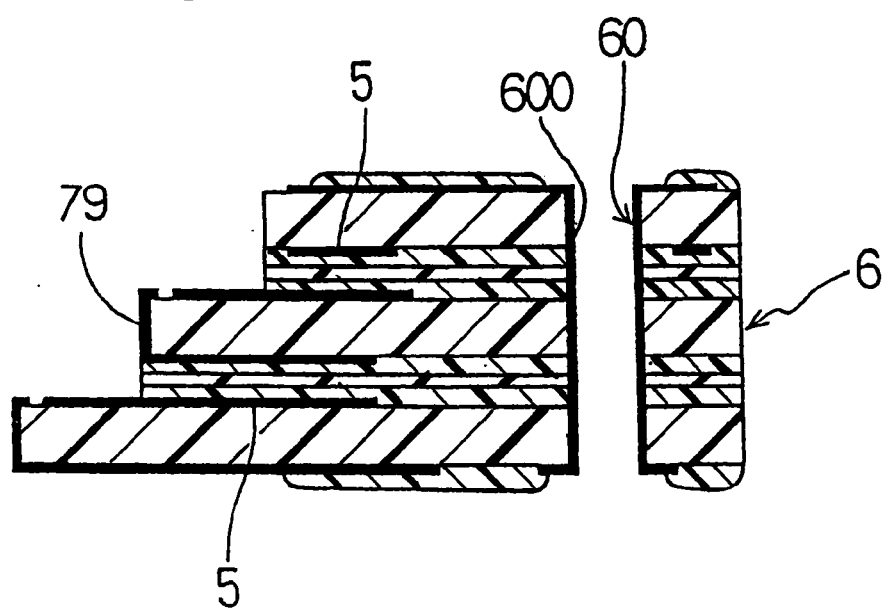
FIG. 4 is an explanatory view of the circuit substrate forming a through hole in the embodiment mode example 1.

Next, as shown in FIG. 4, a through hole 60 extending through the circuit substrate 6 is bored. Next, a metallic plating film 600 constructed by copper is formed on a wall face of the through hole 60 by an electroless plating method and an electrolytic plating method.

Next, as shown in FIG. 5, the above-mentioned joining pin 1 is press-fitted into the through hole 60 from one opening portion 601 of the through hole 60. A surface of the joining pin 1 is covered with solder 2. At this time, as shown in FIG. 2, since an end tip portion 121 of a leg portion 12 of the joining pin 1 is slightly greater than a diameter of the through hole 60, the joining pin 1 is inserted into the through hole 60 while the joining pin 1 presses against a wall face of the through hole 60. When the leg portion 12 is approximately perfectly inserted into the through hole 60, a lower face 111 of a joining head portion 11 is engaged with an opening portion 601 of the through hole 60 so that the insertion of the joining pin 1 is stopped.

Next, as shown in FIG. 6, a soldering material 20 formed in a paste shape is arranged on an opening portion 602 of the through hole 60 on a side opposed to an inserting direction of the joining pin 1.

Figure 7:
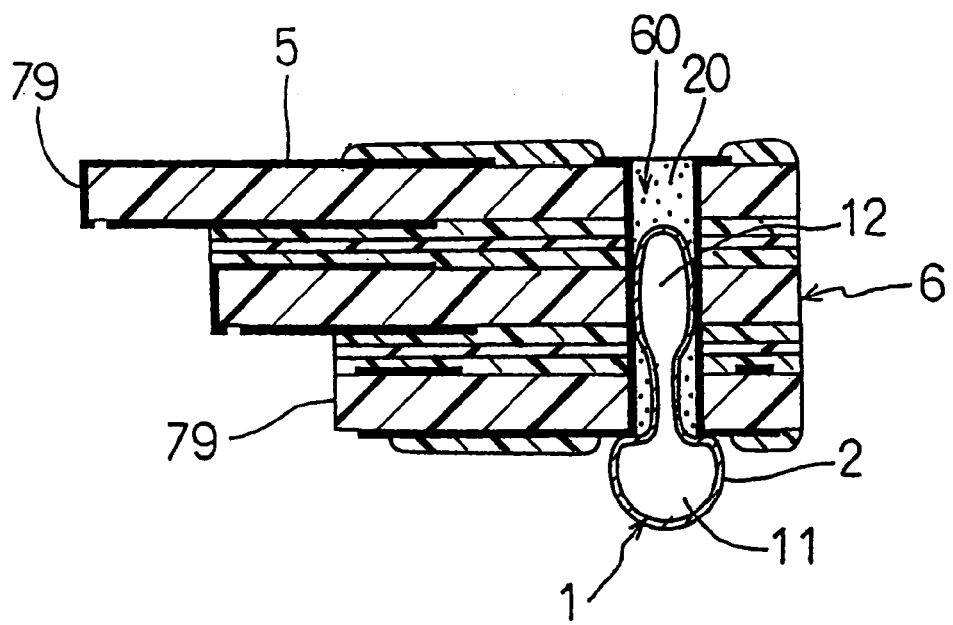
FIG. 7 is an explanatory view showing a state in which the through hole and the joining pin are soldered and joined to each other in the embodiment mode example 1.

Next, as shown in FIG. 7, the soldering material 20 is melted by infrared (IR) reflow, hot air reflow methods, etc. so that the interior of the through hole 60 is filled with the soldering material 20. Thus, the leg portion 12 of the joining pin 1 is joined to the through hole 60 by the soldering material 20.

Figure 8:
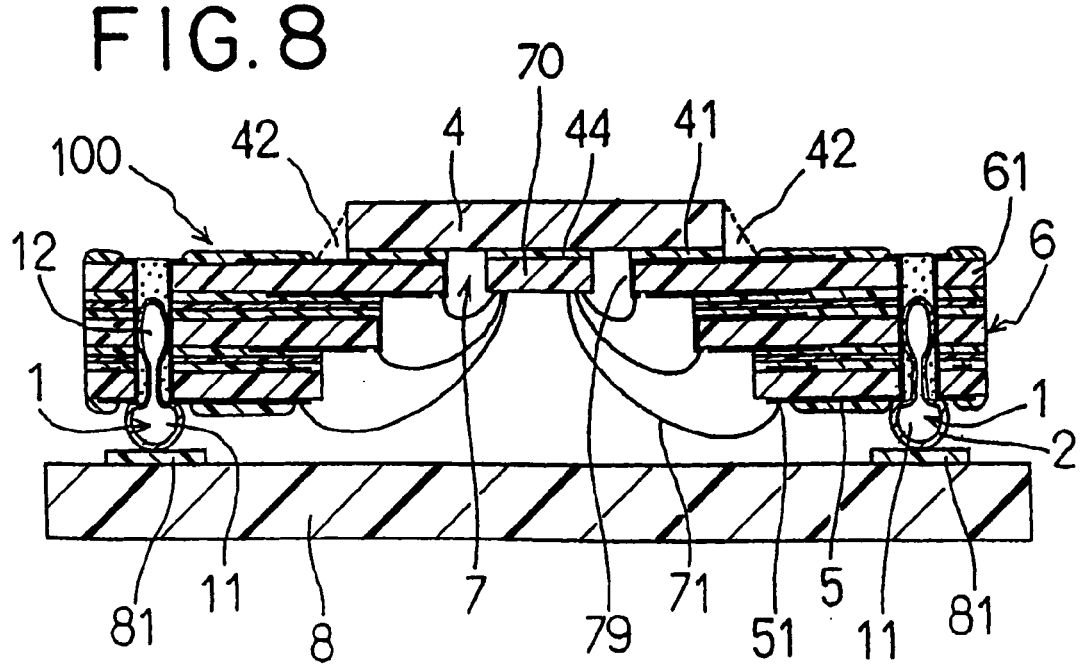
FIG. 8 is an explanatory view showing a state in which the printed wiring board is arranged on a mother board in the embodiment mode example 1.

Next, as shown in FIG. 8, a heat radiating plate 4 is adhered to the circuit substrate 6 by an adhesive 41 constructed by epoxy resin. The heat radiating plate 4 is adhered to the circuit substrate 6 so as to cover an opening portion of the through hole 79 formed in an outermost resin substrate 61. After the adhesion using the above adhesive 41, a side face of the heat radiating plate 4 and a surface of the circuit substrate 6 are joined to each other by an adhesive 42 constructed by solder.

The above printed wiring board 100 is thus obtained.

As shown in FIG. 8, an electronic part 70 is adhered to a mounting portion 7 of the above printed wiring board 100 by an adhesive 44. The electronic part 70 is electrically connected to a bonding pad portion 51 of the conductor circuit 5 by a bonding wire 71. The electronic part 70 and the bonding wire 71 are sealed by resin.

Figure 9:
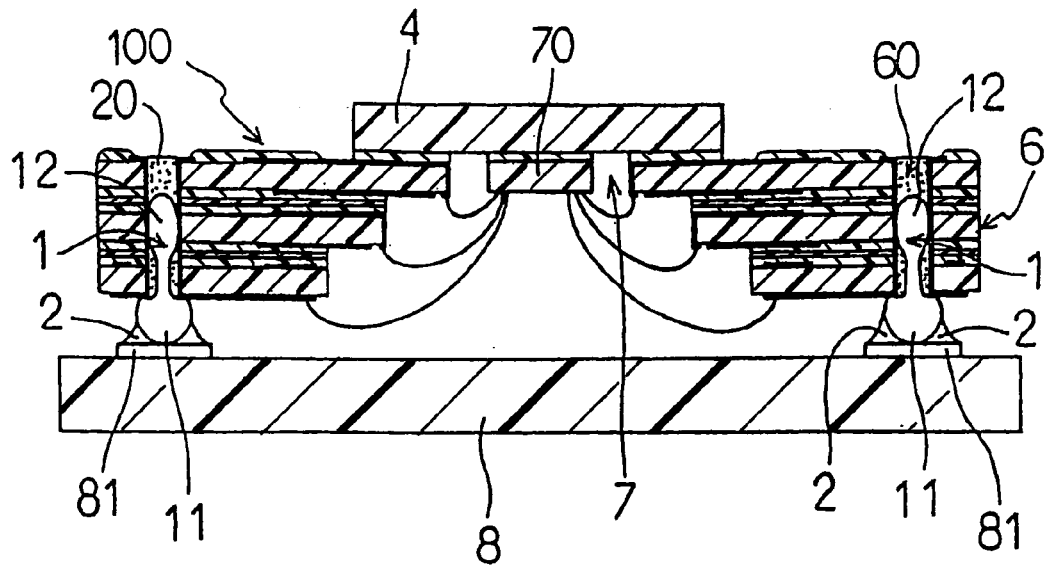
FIG. 9 is an explanatory view showing a state in which the printed wiring board is fixed to the mother board in the embodiment mode example 1.

Next, the joining pin 1 of the printed wiring board 100 is arranged on the surface of an opposite party pad 81 on the mother board 8. Next, as shown in FIG. 9, the solder 2 covering the joining pin 1 is melted by heating the joining pin 1. Thus, the joining head portion 11 of the joining pin 1 and the opposite party pad 81 are joined to each other by the solder 2.

An operation and effects of this example will next be explained.

As shown in FIG. 1, the joining pin 1 is inserted into the through hole 60 in the printed wiring board 100 in this example. The joining pin 1 has the joining head portion 11 for joining and securing the joining pin 1 to the opposite party pad 81. Therefore, the through hole 60 and the opposite party pad 81 can be electrically connected to each other by the joining pin 1 by joining the joining head portion 11 to the opposite party pad 81.

Further, since the through hole 60 and the opposite party pad 81 can be connected to each other by the joining pin 1 in a facing state, it is unnecessary to arrange a pad for mounting a soldering ball in addition to the through hole 60 as in the conventional case. It is also unnecessary to form a conductor circuit for connecting the through hole 60 and the pad for mounting the ball to each other as in the conventional case. Therefore, as shown in FIG. 10, a surplus space is formed on the surface of the circuit substrate 6 in a portion except for the opening portion of the through hole 60. Another conductor circuit 50 can be formed in this space so that a high density wiring structure can be realized.

In particular, in the printed wiring board 100 in this example, as shown in FIG. 9, the mounting portion 7 is opened on a side opposed to the mother board 8, i.e., a projecting side of the joining pin 1. As shown in FIG. 10, many bonding pad portions 51 are arranged in the vicinity of an opening portion of the mounting portion 7. Accordingly, it is necessary to form many conductor circuits 50 for connecting the bonding pad portions 51 and the through hole 60 to each other. Therefore, when many conductor circuits 50 are formed in the above surplus space on the surface of the circuit substrate 6 as in this example, the bonding pad portions 51 and the through hole 60 can be connected and wired at high density.

Accordingly, in the printed wiring board 100 of a facedown type as in this example, it is very significant to have a structure in which the joining pin 1 is inserted into the through hole 60 and is joined to the mother board 8 by the joining head portion 11 of the joining pin 1.

The joining pin 1 is manufactured by using a material unmelted at a heating temperature at which the joining pin 1 is soldered and joined to the opposite party pad 81. Therefore, a constant height of the joining head portion 11 is maintained in the soldering and joining without melting deformation. Accordingly, the joining head portion 11 functions as a strut of the printed wiring board at the soldering and joining times.

As shown in FIG. 2, such a joining head portion 11 functioning as a strut is greater in diameter than an opening diameter of the through hole 60. Therefore, when the leg portion 12 of the joining pin 1 is inserted into the through hole 60, the joining head portion 11 is engaged with the opening portion 601 of the through hole 60 and does not enter the interior of the through hole 60. Accordingly, the joining head portion 11 can be projected by the same height from the surface of the circuit substrate 6.

Therefore, as shown in FIG. 9, when the joining head portion 11 and the opposite party pad 81 is soldered and joined to each other, the distance between the mother board 8 and the printed wiring board 100 is constantly secured by the joining head portion 11. Accordingly, the printed wiring board 100 can be joined to the mother board 8 in a parallel arranging state.

Since no joining pin 1 is melted and deformed at the heating temperature in the soldering and joining, it is not necessary to control a melting state of the solder for joining. Accordingly, the joining pin 1 and the opposite party pad 81 can be easily soldered and joined to each other.

Figure 29:
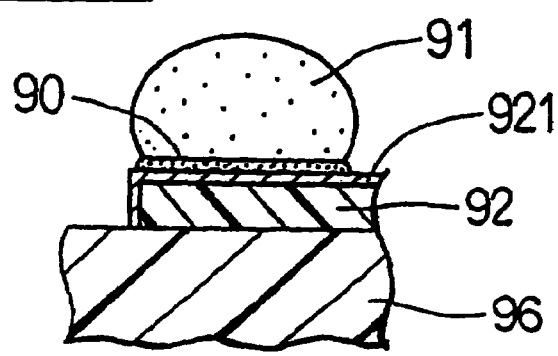
FIG. 29 is an explanatory view showing a problem of a soldering ball in the conventional example.

Further, the leg portion 12 of the joining pin 1 is inserted into the through hole 60, and the leg portion 12 and the through hole 60 are joined to each other by the soldering material 20. Therefore, in the printed wiring board 100 in this example, it is possible to avoid a structure (see FIG. 29) for joining a soldering ball to a pad for mounting the ball as in the conventional example. Accordingly, there is no fear that an intermediate layer is formed between the soldering ball and the pad for mounting the ball. Hence, the joining pin 1 of the invention can be strongly fixed to the through hole 60.

As shown in FIG. 2, the end tip portion 121 of the leg portion 12 of the joining pin 1 is slightly greater in diameter than a diameter of the through hole 60. Therefore, the leg portion 12 is inserted into the through hole 60 while the leg portion 12 presses against a wall face of the through hole 60 and distorts this wall face. Accordingly, the joining pin 1 is fixed to the through hole 60 and does not fall off before solder fills the through hole 60. Further a filling operation of the soldering material 20 can be performed easily.

EMBODIMENT MODE EXAMPLE 2

Figure 11:
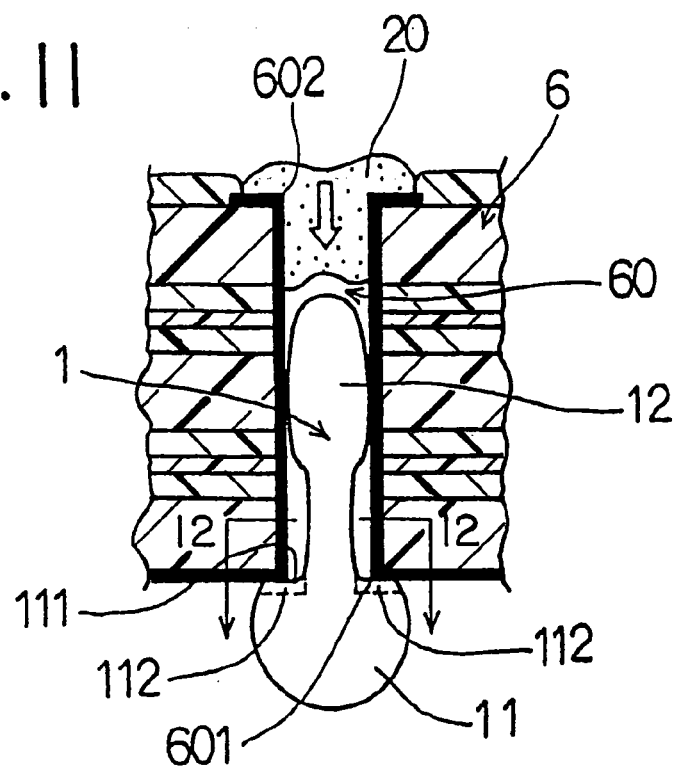
FIG. 11 is a sectional explanatory view of a printed wiring board in an embodiment mode example 2.
Figure 12:
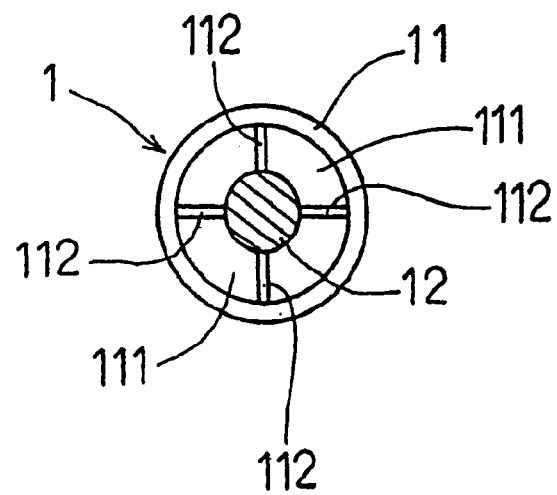
FIG. 12 is a cross-sectional view seen from an arrow line 12—12 of FIG. 11.

In this example, as shown in FIGS. 11 and 12, a groove 112 for extracting the air is formed in a lower portion 111 of the joining head portion 11 of the joining pin 1.

As shown in FIG. 12, four grooves 112 are formed in a radiating shape from a central portion of the lower portion 111 toward its exterior. Each of the grooves 112 has 0.1 mm in width and 0.05 mm in depth.

A surface of the joining pin in this example is covered with unillustrated solder.

The other constructions are similar to those in the embodiment mode example 1.

In this example, as shown in FIG. 11, when a melted soldering material 20 is flowed into the through hole 60, the air existing within the through hole 60 is discharged outward through a portion between an opening portion 601 of the above through hole 60 and each of the grooves 112. Therefore, no air is sealed within the through hole 60. Accordingly, the entire interior of the through hole 60 can be filled with the soldering material 20 without any clearance.

Effects similar to those in the embodiment mode example 1 can be also obtained in this example.

In this example, the interior of the through hole 60 is filled with the soldering material 20 from an opening portion 602 on a side opposed to an inserting direction of the joining pin 1. However, the interior of the through hole 60 can be also filled with the soldering material 20 from the opening portion 601 in a reverse direction, i.e., on the same side as the inserting direction of the joining pin 1. In this case, the interior of the through hole 60 is filled with the soldering material 20 by a method for dipping the above circuit substrate into a melting solder reservoir.

EMBODIMENT MODE EXAMPLE 3

Figure 13:
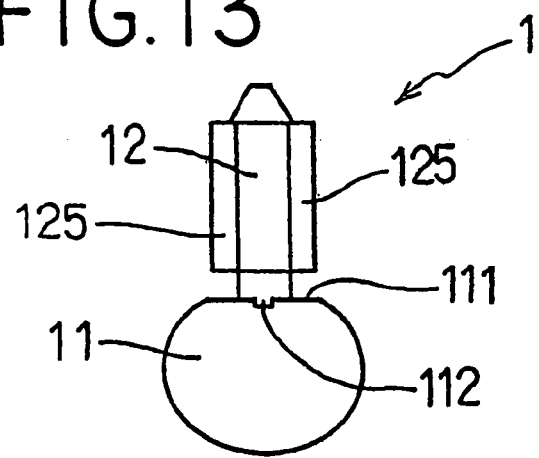
FIG. 13 is a front view of a joining pin in an embodiment mode example 3.
Figure 14:
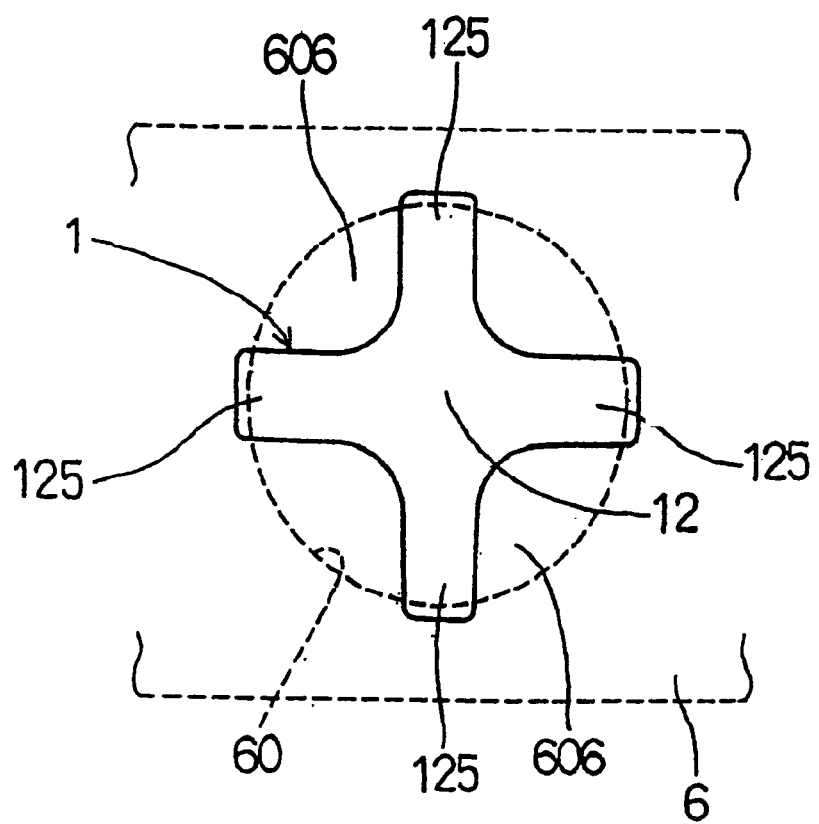
FIG. 14 is a sectional explanatory view of a through hole into which a leg portion of the joining pin is inserted in the embodiment mode example 3.

In this example, as shown in FIGS. 13 and 14, a leg portion 12 of the joining pin 1 has plural projecting portions 125 widened in a radiating shape. Each of the projecting portions 125 has a maximum diameter of 0.35 mm slightly greater than a diameter of the through hole 60.

Figure 15:
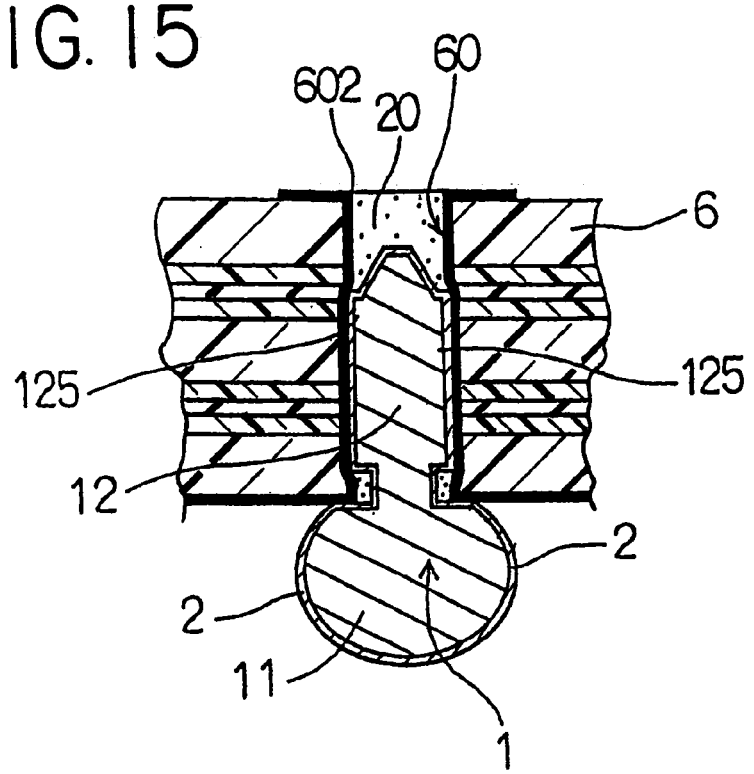
FIG. 15 is a cross-sectional view seen from an arrow line A—A of FIG. 14 in the embodiment mode example 3.
Figure 16:
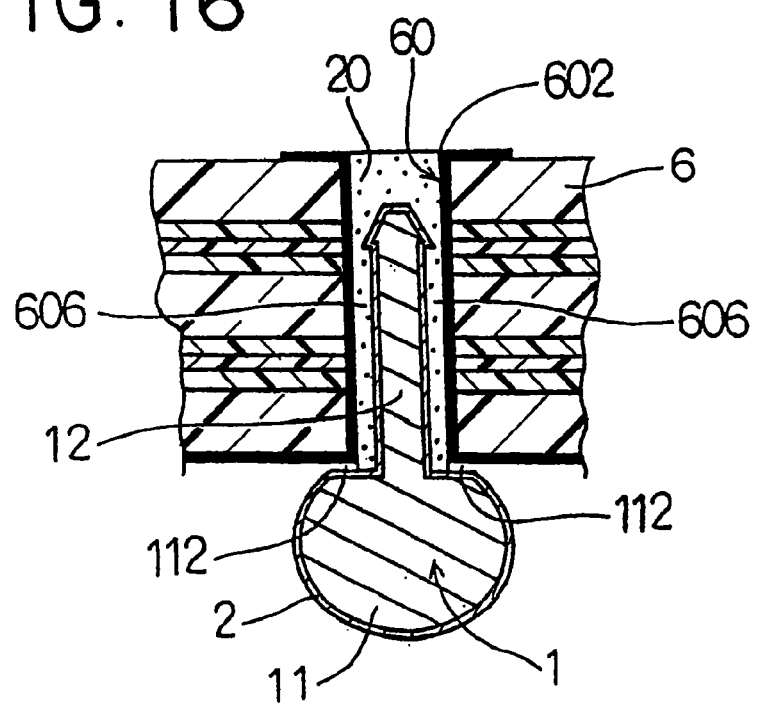
FIG. 16 is a cross-sectional view seen from an arrow line B—B of FIG. 14 in the embodiment mode example 3.

Similar to the embodiment mode example 2, a groove 112 is formed in a joining head portion 11 of the joining pin 1. As shown in FIGS. 15 and 16, a surface of the joining pin 1 is covered with solder 2. The other constructions are similar to those in the embodiment mode example 1.

In this example, as shown in FIGS. 13 and 14, the plural projecting portions 125 are formed in the leg portion 12 of the joining pin 1. Therefore, as shown in FIGS. 15 and 16, when each projecting portion 125 is inserted into the through hole 60, both ends of the projecting portion 125 are inserted into the through hole 60 while both the ends of the projecting portion 125 locally press against a wall face of the through hole 60, since the diametric span (diameter) of the projecting portion 125 is slightly greater than the diameter of the through hole 60. Therefore, it is possible to insert the joining pin 1 by small pressing force in comparison with the joining pin 1 in the embodiment mode example 1 in which an entire inner wall of the through hole 60 is pressed.

Further, as shown in FIG. 16, after the joining pin 1 is inserted into the through hole 60, a melted soldering material 20 flows from an opening portion 602 on a side opposed to the inserting direction of the joining pin 1, and fills the interior of the through hole 60. At this time, as shown in FIGS. 14 and 16, the air existing within the through hole 60 is discharged outward through a clearance 606 between the through hole 60 and the leg portion 12 of the joining pin 1, and the groove 112. Therefore, the interior of the through hole 60 can be filled with the soldering material 20 without sealing the air.

EMBODIMENT MODE EXAMPLE 4

Figure 17:
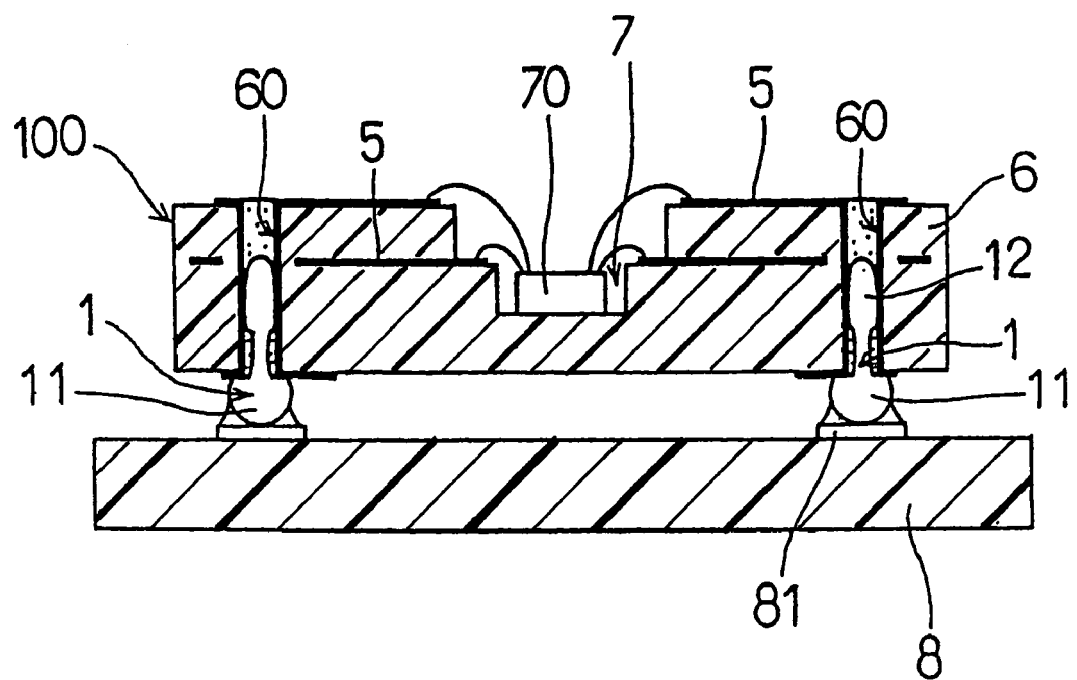
FIG. 17 is a cross-sectional view of a printed wiring board in an embodiment mode example 4.

As shown in FIG. 17, in a printed wiring board in this example, a concave mounting portion 7 for mounting an electronic part 70 constitutes a substrate of a face-up type for mounting electronic parts and opened on a side opposed to a mother board 8. A joining head portion 11 of the joining pin 1 is projected from the through hole 60 on a side opposed to the mother board 8 in the circuit substrate 6. The other constructions are similar to those in the embodiment mode example 1.

In this example, similar to the embodiment mode example 1, surface high density wiring of the circuit substrate 6 can be performed and the printed wiring board can be joined to the mother board 8 in parallel with this mother board 8 and is excellent in joining strength.

EMBODIMENT MODE EXAMPLE 5

A printed wiring board in an embodiment mode example of the present invention will be explained by using FIGS. 18 to 24.

Figure 18:
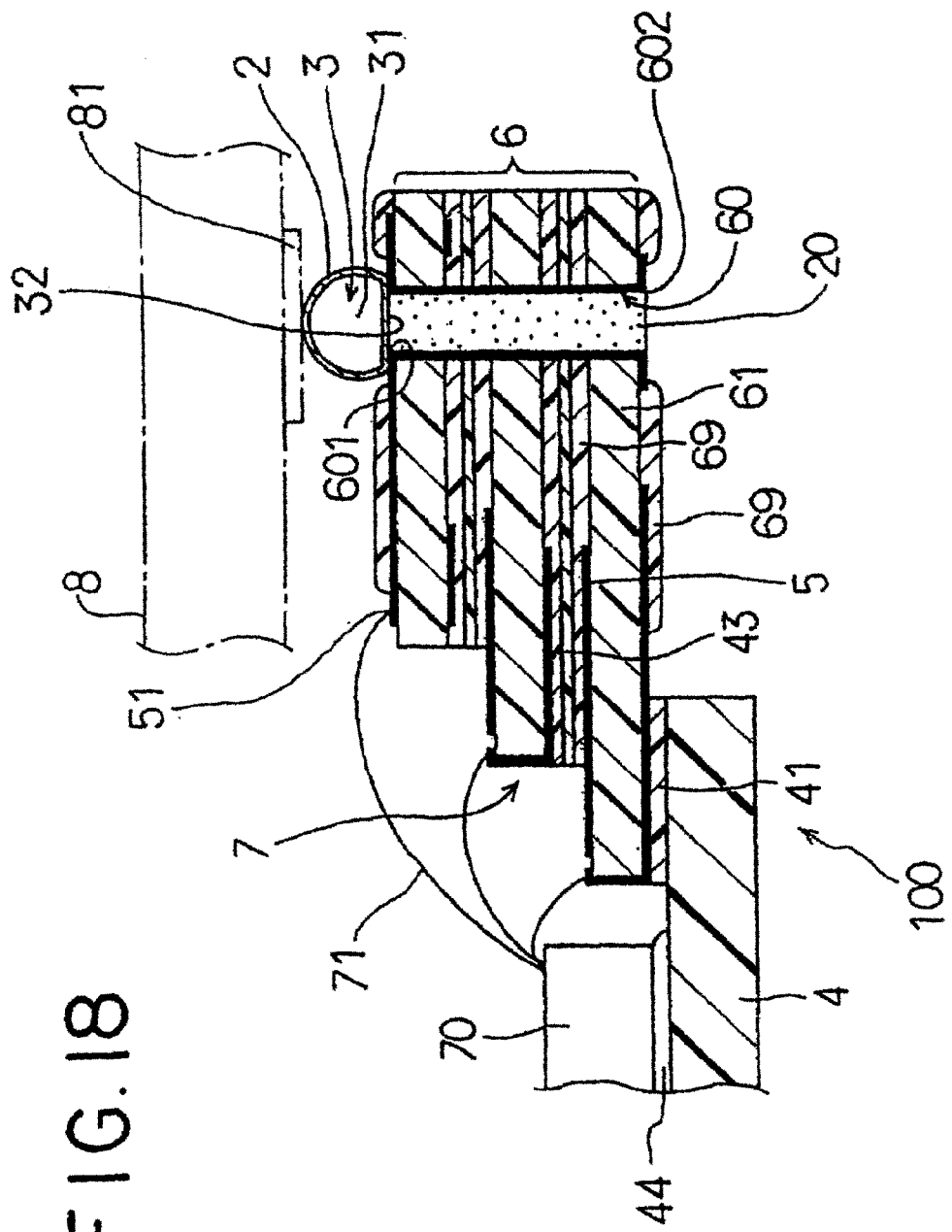
FIG. 18 is a partial sectional view of a printed wiring board in an embodiment mode example 5.

As shown in FIG. 18, the printed wiring board 100 in this example has a circuit substrate 6 having a conductor circuit 5 and a through hole 60, and a joining ball 3 joined to the through hole 60.

The joining ball 3 is manufactured by using a material unmelted at a heating temperature when the joining ball 3 is soldered and joined to an opposite party pad 81 on a mother board 8. For example, the joining ball 3 is manufactured by using covar, phosphor bronze, etc. The joining ball 3 is constructed by a joining head portion 31 and a bottom portion 32. The joining head portion 31 is greater in diameter than the diameter of an opening portion 601 of the through hole 60 and forms a joining portion for joining and connection to the opposite party pad 81. The bottom portion 32 is opposed to the opening portion 601 of the through hole 60. The bottom portion 32 is arranged in the opening portion 601 of the through hole 60 and is joined to the through hole 60 by a soldering material 20 filling the interior of the through hole 60.

The joining head portion 31 and the bottom portion 32 of the joining ball 3 are covered with solder 2 having 0.01 to 0.015 mm in thickness.

Figure 19:
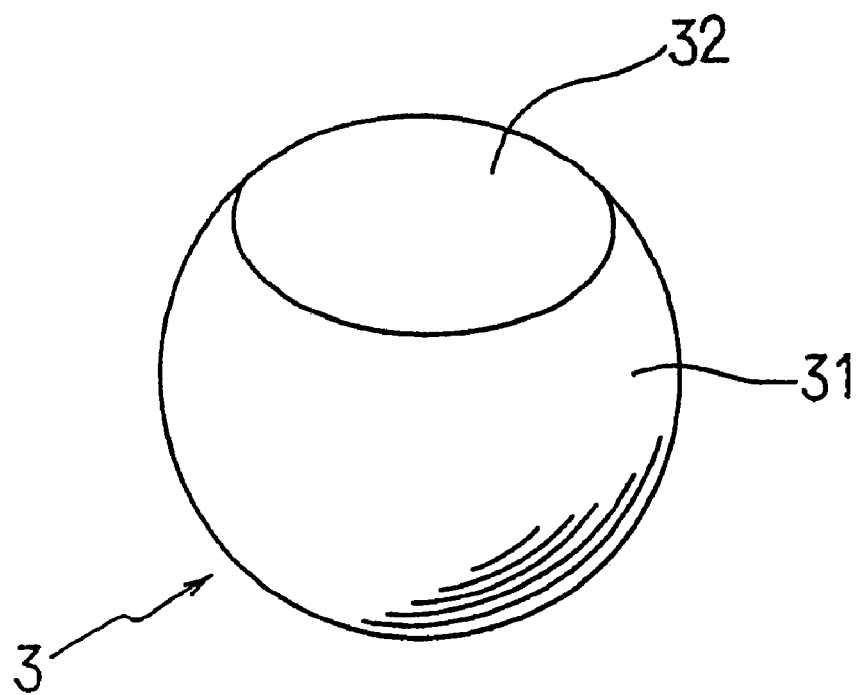
FIG. 19 is a perspective view of a bottom portion of a joining ball in the embodiment mode example 5.

As shown in FIG. 19, the joining head portion 31 of the joining ball 3 is formed in the shape of a spherical body having 0.75 mm in diameter. The bottom portion 32 is formed in a flat face shape and a circular shape having 0.6 mm in diameter. The opening portion 601 of the through hole 60 has 0.32 mm in diameter.

In the printed wiring board 100 in this example, the other structures of the above joining ball 3 are similar to those in the embodiment mode example 1.

A manufacturing method of the above printed wiring board will next be explained in detail.

Similar to the embodiment mode example 1, a multilayer circuit substrate 6 having a through hole 60 is first formed (see FIGS. 3 and 4).

Figure 20:
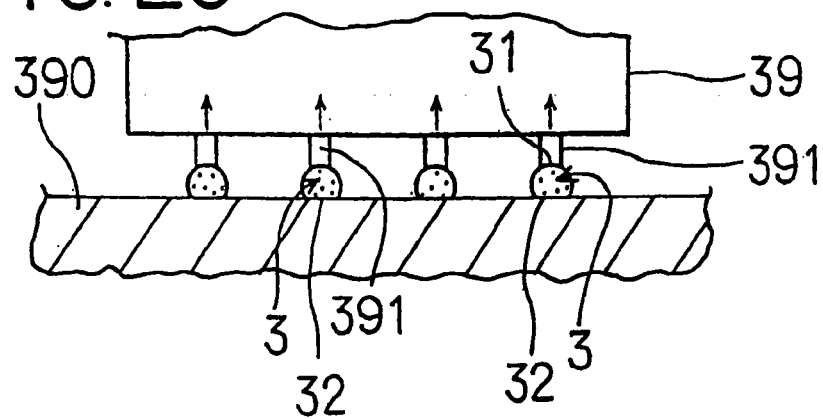
FIG. 20 is an explanatory view showing a method for adsorbing the joining ball to a sucking device in the embodiment mode example 5.

Next, as shown in FIG. 20, a joining ball 3 is arranged on a flat face base 390. At this time, a bottom portion 32 of the joining ball 3 is set to face the flat face base 390 by slightly vibrating the flat face base 390, and a joining head portion 31 is directed upward. Next, the joining head portion 31 of the joining ball 3 is adsorbed and held by suction at a sucking port 391 of a sucking (negative pressure or suction) device 39 by making the sucking port 391 approach the flat face base 390.

Figure 21:
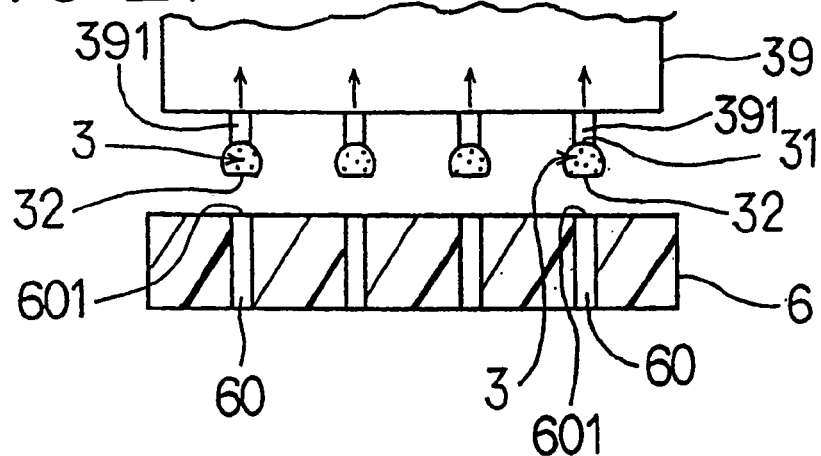
FIG. 21 is an explanatory view showing a method for mounting the joining ball to an opening portion of a through hole in the embodiment mode example 5.

Next, as shown in FIG. 21, the sucking device 39 is moved above the above circuit substrate 6 while the sucking device 39 adsorbs and holds the joining ball 3. Positions of the joining ball 3 and the through hole 60 are aligned with each other. Next, the sucking device 39 is set to approach the circuit substrate 6 and the joining ball 3 is arranged in the opening portion 601 of the through hole 60 arranged in the circuit substrate 6. At this time, since the joining head portion 31 of the joining ball 3 is adsorbed and held in the sucking port 391, the bottom portion 32 of the joining ball 3 faces the opening portion 601.

Figure 22:
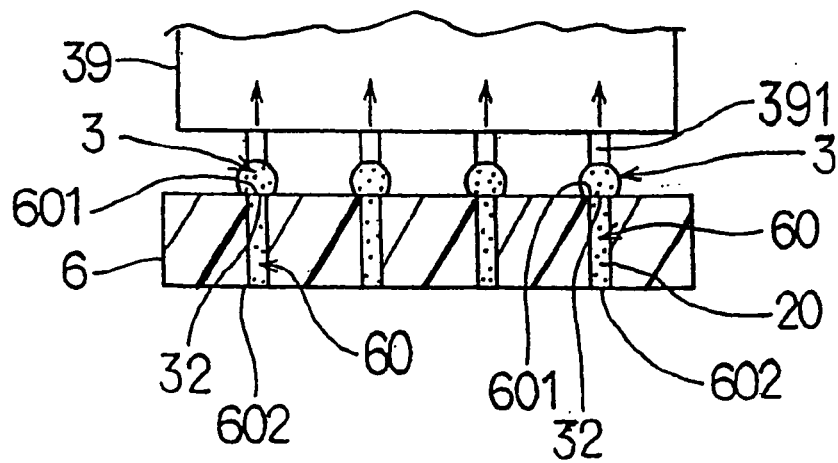
FIG. 22 is an explanatory view showing a method for filling the interior of the through hole with a soldering material in the embodiment mode example 5.

Next, as shown in FIG. 22, the interior of the through hole 60 is filled with a soldering material 20 from an opening portion 602 on an unarranging side of the joining ball 3 in a fixing state of the sucking device 39 and the circuit substrate 6.

At this time, when the opening portion 601 is closed by the bottom portion 32 of the joining ball 3, it is difficult for the soldering material 20 to enter the through hole 60. Therefore, the interior of the through hole 60 is filled with the soldering material 20 such as by a method for dipping the circuit substrate into a soldering bath, a method for applying a supersonic wave to the soldering bath dipping the circuit substrate thereinto, etc.

Next, the soldering material 20 is cooled, solidified and congealed. Thus, the joining ball 3 is joined to the through hole 60 by the soldering material 20. Thereafter, the sucking port 391 is detached from the joining ball 3 by weakening sucking force (suction pressure) of the sucking device 39.

Figure 23:
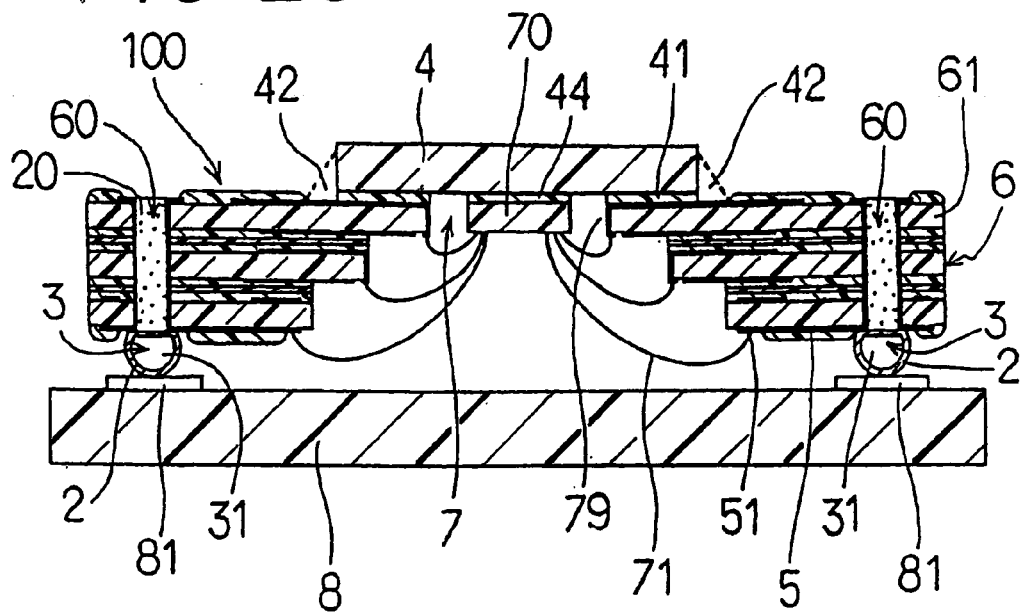
FIG. 23 is an explanatory view showing a state in which the printed wiring board is arranged on a mother board in the embodiment mode example 5.

Next, as shown in FIG. 23, a heat radiating plate 4 is adhered to the circuit substrate 6 by an adhesive 41 constructed by epoxy resin. The heat radiating plate 4 is adhered to the circuit substrate 6 so as to cover an opening portion of a through hole 79 formed in an outermost resin substrate 61. After the adhesion using the adhesive 41, there is also a case in which a side face of the heat radiating plate 4 and a surface of the circuit substrate 6 are joined to each other by an adhesive 42 constructed by solder.

Thus, the above printed wiring board 100 is obtained.

As shown in FIG. 23, an electronic part 70 is adhered to a mounting portion 7 by an adhesive 44 in the above printed wiring board 100. The electronic part 70 and a bonding pad portion 51 of a conductor circuit 5 are electrically connected to each other by a bonding wire 71. Then, the electronic part 70 and the bonding wire 71 are sealed by resin.

Figure 24:
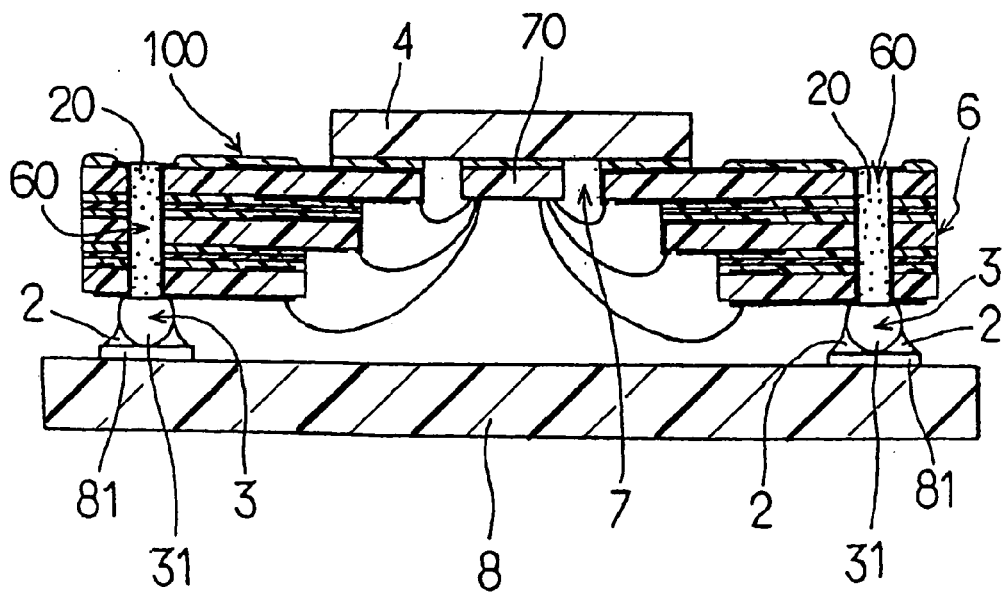
FIG. 24 is an explanatory view showing a state in which the printed wiring board is fixed to the mother board in the embodiment mode example 5.

Next, the joining ball 3 of the printed wiring board 100 is arranged on the surface of an opposite party pad 81 on a mother board 8. Next, as shown in FIG. 24, solder 2 covering the joining ball 3 is melted by heating this joining ball 3. Thus, the joining head portion 31 of the joining ball 3 and the opposite party pad 81 are joined to each other by the solder 2.

Next, an operation and effects of this example will next be explained.

In the printed wiring board 100 in this example, as shown in FIG. 18, the joining ball 3 is joined to the through hole 60. The joining ball 3 has the joining head portion 31 for joining the joining ball 3 to the opposite party pad 81. Therefore, the through hole 60 and the opposite party pad 81 can be electrically connected to each other by the joining ball 3 by joining the joining head portion 31 to the opposite party pad 81.

The joining ball 3 is joined to the opening portion 601 of the through hole 60. Therefore, the through hole 60 and the opposite party pad 81 can be electrically connected to each other in a facing state. Accordingly, it is unnecessary to arrange a pad for mounting a soldering ball in addition to the through hole 60 for this invention as in the conventional case. It is also unnecessary to form a conductor circuit for connecting the through hole 60 and the pad for mounting the ball in this invention as in the conventional case. Therefore, a surplus space is formed on a surface of the circuit substrate 6 in a portion except for the through hole 60 (see FIG. 10). Another conductor circuit 50 can be formed in this space so that a high density wiring structure can be realized.

Similar to the embodiment mode example 1, the printed wiring board 100 in this example is particularly of a face-down type as shown in FIG. 24. Therefore, a structure for fixedly joining the joining ball 3 to the through hole 60 and joining the printed wiring board 100 to the mother board 8 by the joining head portion 31 of the joining ball 3 is very significant to realize high density wiring between many bonding pad portions 51 and the through hole 60.

The joining ball 3 is manufactured by using a material unmelted at a heating temperature when the joining ball 3 is soldered and joined to the opposite party pad 81. Therefore, a constant height of the joining ball 3 is maintained without melting deformation in the soldering and joining. Accordingly, the joining ball 3 functions as a strut of the printed wiring board 100 at the soldering and joining times.

Further, the joining head portion 31 of such a joining ball 3 functioning as a strut is greater than the opening portion 601 of the through hole 60. Therefore, when the joining ball 3 is joined to the through hole 60, the joining head portion 31 is engaged with the opening portion 601 of the through hole 60 and does not enter the interior of the through hole 60. Accordingly, the joining head portion 31 can be projected by the same height from the surface of the circuit substrate 6.

Therefore, as shown in FIG. 24, when the joining head portion 31 and the opposite party pad 81 are soldered and joined to each other, the distance between the mother board 8 and the printed wiring board 100 is constantly secured by the joining head portion 31. Accordingly, the printed wiring board 100 can be joined to the mother board 8 in a parallel arranging state.

Further, since no joining ball 3 is melted and deformed at the heating temperature in the soldering and joining, it is not necessary to control a melting state of the solder for joining. Accordingly, the joining ball 3 and the opposite party pad 81 can be easily soldered and joined to each other.

The bottom portion 32 of the joining ball 3 is joined to the opening portion 601 of the through hole 60 by the soldering material 20. Therefore, similar to the embodiment mode example 1, there is no fear that an intermediate layer causing a reduction in joining strength is formed. Accordingly, the joining ball 3 can be strongly fixed to the through hole 60.

EMBODIMENT MODE EXAMPLE 6

Figure 25:
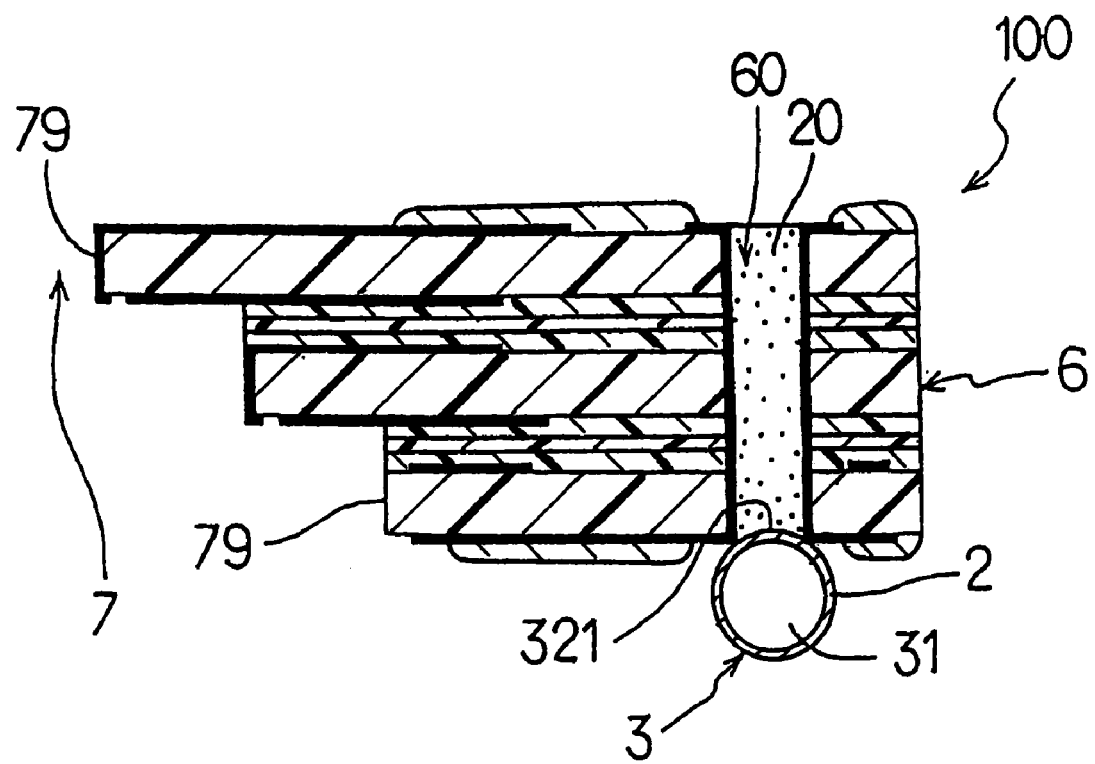
FIG. 25 is a sectional explanatory view of a printed wiring board in an embodiment mode example 6.

In this example, as shown in FIG. 25, a bottom portion 321 of the joining ball 3 constitutes one portion of a spherical surface.

Namely, an entire shape of the joining ball 3 including the joining head portion 31 and the bottom portion 321 is formed as a spherical body having 0.75 mm in diameter. Therefore, a joining area of an inner wall of the through hole 60 and a soldering material 20 is increased. Accordingly, the joining ball 3 is more reliably joined to the through hole 60. The other constructions are similar to those in the embodiment mode example 5, and effects similar to those in the embodiment mode example 5 can be obtained.

EMBODIMENT MODE EXAMPLE 7

Figure 26:
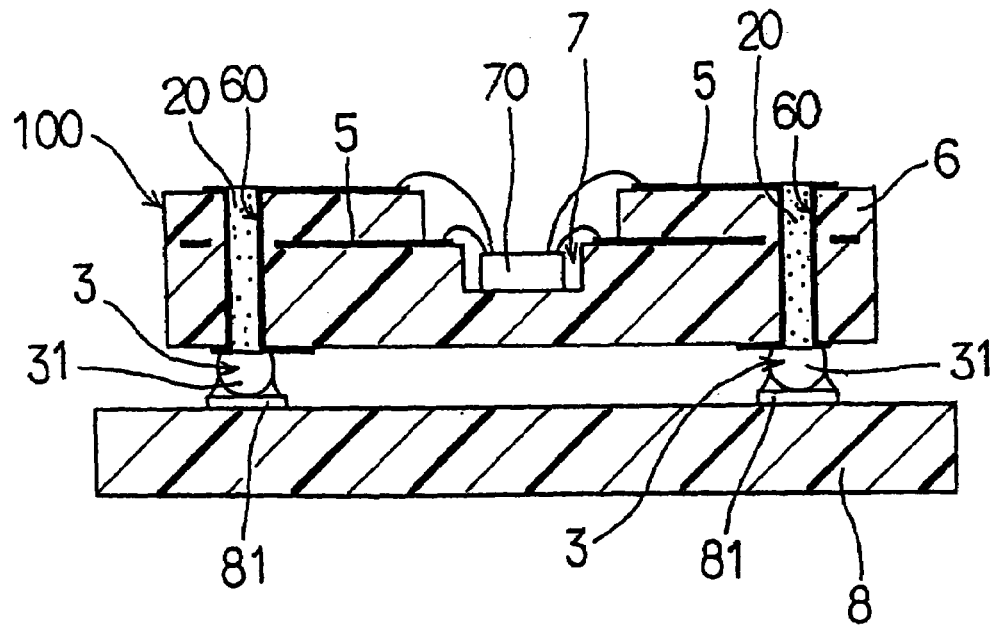
FIG. 26 is a sectional explanatory view of a printed wiring board in an embodiment mode example 7.
Figure 27:
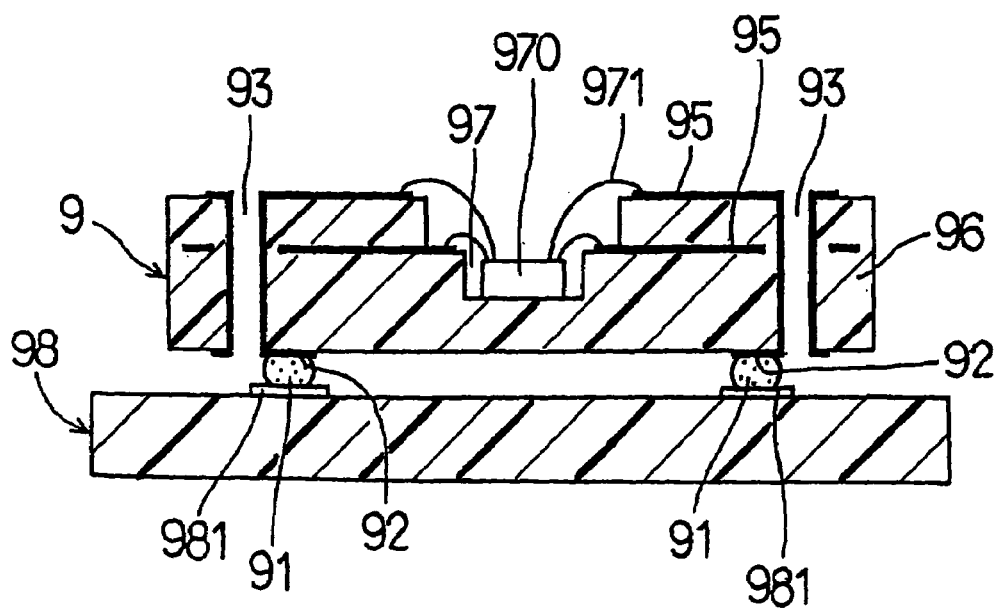
FIG. 27 is a cross-sectional view of a printed wiring board in a conventional example.
Figure 28:
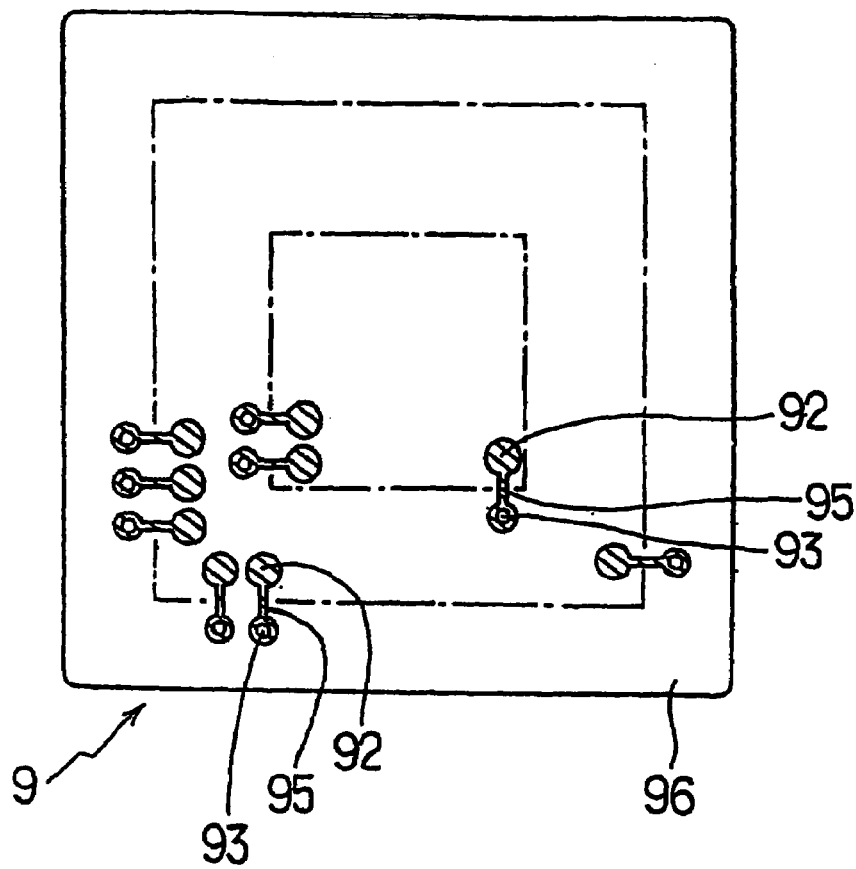
FIG. 28 is a rear view of the printed wiring board in the conventional example.

As shown in FIG. 26, a printed wiring board 100 in this example comprises a substrate of a face-up type for mounting electronic parts in which a concave mounting portion 7 for mounting an electronic part 70 is opened on a side opposed to a mother board 8. A joining head portion 31 of the joining ball 3 is projected from the through hole 60 on a side opposed to the mother board 8 in the circuit substrate 6.

The other constructions are similar to those in the embodiment mode example 5.

In this example, similar to the embodiment mode example 5, high density wiring can be performed on a surface of the circuit substrate. The printed wiring board can also be joined to the mother board and positioned and connected in parallel with this mother board to provide a superior joining strength.

Industrial Applicability

As mentioned above, the present invention can provide a printed wiring board and its manufacturing method in which high density wiring can be performed on a substrate surface and the printed wiring board can be joined to a partner member in parallel with this partner member and has an excellent joining strength.

Although embodiments and examples of the invention have been shown and described, it is to be understood that various modifications, substitutions, and rearrangements of components, parts, and structural features, as well as other uses of the invention, and other methods of manufacturing the invention, can be made by those skilled in the art without departing from the novel spirit and scope of the invention.

The invention claimed is:

1. A manufacturing method of a printed wiring board characterized in that the manufacturing method comprises:
    a process for preparing a circuit substrate having a conductor circuit and a through hole;
    a process for manufacturing a joining ball formed by a material unmelted at a heating temperature in solder joining the joining ball to an opposite party pad, which is covered with a conductive material comprising solder, and constructed by a bottom portion and a joining head portion greater than an opening portion of said through hole and forming a joining portion to the opposite party pad;
    a process for arranging said joining ball in a state in which said bottom portion faces the opening of said through hole; and
    a process for filling the interior of said through hole with conductive material and joining said through hole and said bottom portion of the joining ball to each other by the conductive material comprising the solder.

2. The manufacturing method of the printed wiring board as claimed in claim 1 wherein the process for arranging said joining ball and the process for filling the interior of said through hole with said conductive material are performed in a state in which the joining head portion of said joining ball is absorbed to a sucking port of a sucking device.

3. The manufacturing method of the printed wiring board as claimed in claim 1, wherein said joining head portion is a sphere, and said bottom portion is plane.

4. The manufacturing method of the printed wiring board as claimed in claim 1, wherein said conductive material within said through hole is solder.

5. The manufacturing method of the printed wiring board as claimed in claim 1, wherein said interior of the through hole is filled with the conductive material by a method for dipping the circuit substrate into a soldering bath, or a method for applying a supersonic wave to the soldering bath dipping the circuit substrate thereinto.

* * * * *